US012727183B2

(12) United States Patent
Yamaguchi et al.

(10) Patent No.: US 12,727,183 B2
(45) Date of Patent: Sep. 1, 2026

(54) METHOD OF MANUFACTURING SEMICONDUCTOR DEVICE

(71) Applicant: RENESAS ELECTRONICS CORPORATION, Tokyo (JP)

(72) Inventors: Tadashi Yamaguchi, Tokyo (JP); Yoshiki Maruyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 468 days.

(21) Appl. No.: 18/449,763

(22) Filed: Aug. 15, 2023

(65) Prior Publication Data

US 2024/0120406 A1 Apr. 11, 2024

(30) Foreign Application Priority Data

Oct. 6, 2022 (JP) ................................ 2022-161345

(51) Int. Cl.

| | |
|---|---|
| ***H10D 12/01*** | (2025.01) |
| ***H10D 64/01*** | (2025.01) |
| ***H10P 30/20*** | (2026.01) |
| ***H10P 30/22*** | (2026.01) |
| ***H10P 32/10*** | (2026.01) |
| ***H10P 32/14*** | (2026.01) |

(52) U.S. Cl.

CPC ..... *H10D 12/038* (2025.01); *H10D 64/01346* (2026.01); *H10P 30/204* (2026.01); *H10P 30/21* (2026.01); *H10P 30/22* (2026.01); *H10P 32/1406* (2026.01); *H10P 32/171* (2026.01)

(58) Field of Classification Search

CPC .................................................... H10D 12/038

See application file for complete search history.

(56) References Cited

U.S. PATENT DOCUMENTS

| | | | | |
|---|---|---|---|---|
| 9,041,050 | B2 | 5/2015 | Matsuura | |
| 2009/0278166 | A1 | 11/2009 | Soeno et al. | |
| 2012/0313139 | A1* | 12/2012 | Matsuura ............ | H10D 62/393 257/617 |
| 2013/0175574 | A1* | 7/2013 | Matsuura ............ | H10D 64/117 438/138 |

(Continued)

FOREIGN PATENT DOCUMENTS

| | | |
|---|---|---|
| JP | 2009-272550 A | 11/2009 |
| JP | 2013-140885 A | 7/2013 |

(Continued)

OTHER PUBLICATIONS

Notice of Reasons for Refusal issued in corresponding Japanese Patent Application No. 2022-161345, dated Nov. 18, 2025.

*Primary Examiner* — Erik Kielin

(74) *Attorney, Agent, or Firm* — Rimon P.C.

(57) ABSTRACT

It is related to improving a performance of a semiconductor device and suppressing yield deterioration. Using a resist pattern as a mask, an ion-implantation is performed from an upper surface of a semiconductor substrate to form an ion-implanted layer in the semiconductor substrate. By subsequently, another ion-implantation is performed. Then, another ion-implanted layer is formed in the semiconductor substrate so as to overlap with the ion-implanted layer. Next, a heat treatment is performed on the semiconductor substrate to diffuse impurities contained in the ion-implanted layers, thereby an p-type floating region is formed.

16 Claims, 16 Drawing Sheets

(56) References Cited

U.S. PATENT DOCUMENTS

| | | | | |
|---|---|---|---|---|
| 2015/0340480 | A1* | 11/2015 | Matsuura | H10D 64/231 257/144 |
| 2016/0197171 | A1 | 7/2016 | Onozawa et al. | |
| 2019/0326432 | A1* | 10/2019 | Nakazawa | H10D 8/411 |
| 2020/0066887 | A1* | 2/2020 | Imai | H10D 12/481 |
| 2020/0266109 | A1 | 8/2020 | Toyoda | |

FOREIGN PATENT DOCUMENTS

| | | | |
|---|---|---|---|
| JP | 2020-136402 | A | 8/2020 |
| WO | 2015/141327 | A1 | 9/2015 |

* cited by examiner

FIG. 1

EE
EP
1A
FLW
FLW
2A
100
GW
GP
X
Y
Z

FIG. 3

A − A CROSS - SECTIONAL VIEW

FIG. 4

2A
FLW
IL
IF1
PR
PFR
NV
NS
PC
CE
PG
CH
SUB
Z
X
Y

A − A CROSS - SECTIONAL VIEW

FIG. 6

A − A CROSS - SECTIONAL VIEW

RP1
RP1
RP1
NV
NHB3
NHB2
NHB1
NHB3
NHB2
NHB1
SUB
Z
Y
X

A − A CROSS - SECTIONAL VIEW
PF2
PF1
NV
RP2
NHB3
NHB2
NHB1
PF2
PF1
RP2
NHB3
NHB2
NHB1
PF2
PF1
SUB
Z
X
Y

FIG. 8

A − A CROSS - SECTIONAL VIEW

PF
NV
NHB
PF
NHB
PF
SUB
Z
X
Y

A – A CROSS - SECTIONAL VIEW

A − A CROSS - SECTIONAL VIEW
CF1
GI
TR
PF
NV
NHB
TR
PF
TR
NHB
TR
PF
SUB
X
Z
Y

A – A CROSS - SECTIONAL VIEW

A – A CROSS - SECTIONAL VIEW

A − A CROSS - SECTIONAL VIEW

FIG. 15

A – A CROSS - SECTIONAL VIEW

A – A CROSS - SECTIONAL VIEW
RP2
RP2
PF3
NV
PF3a
NHB3
NHB2
NHB1
PF3a
PF3
NHB3
NHB2
NHB1
PF3a
PF3
SUB
Z
X
Y

METHOD OF MANUFACTURING SEMICONDUCTOR DEVICE

CROSS-REFERENCE TO RELATED APPLICATIONS

The disclosure of Japanese Patent Application No. 2022-161345 filed on Oct. 6, 2022, including the specification, drawings and abstract is incorporated herein by reference in its entirety.

BACKGROUND

The present disclosure relates to a method of manufacturing a semiconductor device, and more particularly, to a method of manufacturing a semiconductor device including a gate electrode formed in a trench.

In recent years, a semiconductor device including a power-semiconductor device such as an IGBT (Insulated Gate Bipolar Transistor) has been widely used. In addition, as the IGBT having a lower on-resistance, the gate electrode is embedded in the trench and a structure is used.

For example, Japanese Patent Laid-Open No. 2013-140885 (Patent Document 1) discloses an IGBT of a GGEE structure using an IE (Injection Enhancement) effect. The IE effect is a technique for increasing a concentration of charges accumulated in a drift region by making it difficult for holes to be discharged to an emitter electrode EE when the IGBT is in an on-state.

Note that "G" of the GGEE structure means a structure in which the gate electrode connected to a gate potential is embedded in the trench, and is called a gate trench. In addition, "E" of the GGEE structure means a structure in which the gate electrode connected to an emitter potential is embedded in the trench, and is called an emitter trench. Accordingly, the GGEE structure is a structure in which a pair of the emitter trenches is formed at a position somewhat away from the pair of gate trenches.

As also disclosed in Patent Document 1, a p-type floating region is formed in a semiconductor substrate between the pair of gate trenches and the pair of emitter trenches to utilize an IE effect. The p-type floating region is formed to a position deeper than a depth of each of the pair of gate trenches and the pair of emitter trenches. In addition, an n-type hole barrier region having a higher impurity concentration than the drift region is formed in the semiconductor substrate sandwiched between the pair of gate trenches and the pair of emitter trenches.

SUMMARY

In order to form the floating region and the hole barrier region, a method is generally used in which impurities are introduced into a relatively shallow position in the semiconductor substrate by ion-implantation method, a trench is formed, and then the impurities are diffused by a heat treatment. For example, Patent Document 1 also discloses such an approach. However, in order to diffuse the impurities for the floating region to a position deeper than the depth of the trench, a high temperature and a long-time heat treatment are required. Such the heat treatment is performed, for example, an inside a furnace body filled with an inert gas under conditions at a temperature of 1200 degree Celsius with a process time of 30 minutes.

The inside the furnace body, a bottom surface of the semiconductor substrate (wafer) is supported by a support member called a wing board or the like, but in the high temperature and the long-time heat treatment, the wafer is damaged by its own weight at points of contact. between the wafer and the support member, and a slip may occur starting from a scratch. Slip is a crystal dislocation defects generated during plastic deformation of a crystal at the high temperature. When a large number of crystal dislocation defects are stacked, a step may occur on a surface of the wafer. Therefore, when the slip occurs, there is a problem that a yield decrease and a manufacturing cost increase. Further, in recent years, since a large-diameter wafer such as a 300 mm is used, the weight of the wafer tends to become heavier, and slip is likely to occur.

When the floating region is to be formed so as to cover a bottom surface of the trench, the impurities need to be diffused not only in a depth direction but also in a lateral direction. However, in a control by thermal diffusion for a long period of time, it is difficult to accurately adjust a formation position of the floating region because a controllability is not so high. Further, there is a problem that it is also difficult to design a profile of an impurity concentration.

A main purpose of this application is to provide a technique capable of accuracy adjusting a position where the floating region is formed, lowering a temperature of a heat treatment as much as possible, and shortening a time of the heat treatment as much as possible. This improves a performance of the semiconductor device and suppresses a decrease in yield. Other objects and novel features will become apparent from the description of this specification and the accompanying drawings.

The typical ones of the embodiments disclosed in the present application will be briefly described as follows.

A semiconductor device according to one embodiment of the present invention includes: (a) preparing a semiconductor substrate of a first conductivity type having an upper surface and a bottom surface opposite to the upper surface; (b) forming a first resist pattern on the upper surface of the semiconductor substrate; (c) forming a first ion-implantation layer and a second ion-implantation layer in the semiconductor substrate by performing a first ion-implantation with a first ion-implantation energy by using the first resist pattern as a mask; (d) forming a third ion-implantation layer at a position overlapping the first ion-implantation layer in the semiconductor substrate in plan view and forming a fourth ion-implantation layer at a position overlapping the second ion-implantation layer in the semiconductor substrate in plan view by performing a second ion-implantation with a second ion-implantation energy different of the first ion-implantation energy by using the first resist pattern as a mask; (e) removing the first resist pattern; (f) by performing a first heat treatment for the semiconductor substrate, forming a first impurity region of a second conductivity type opposite to the first conductivity type by diffusing impurities included in the first ion-implantation layer and the third ion-implantation layer and forming a second impurity region of the second conductivity type by diffusing impurities included in the second ion-implantation layer and the fourth ion-implantation layer; (g) forming a first trench and a second trench on the upper surface of the semiconductor substrate; (h) forming a first gate insulating film on a side surface of the first trench and forming a second gate insulating film on a side surface of the second trench; and (i) forming a first gate electrode so as to fill in the first trench via the first gate insulating film and forming a second gate electrode so as to fill in the second trench via the second gate insulating film. And the first trench has a first side surface, a second side surface facing to the first side surface and a first bottom surface connecting the first side surface and the second side surface, the second trench has a third side surface, a fourth side surface facing to the third side surface and a second bottom surface connecting the third side surface and the fourth side surface, the first trench and the second trench are separate apart from so as to the second side surface and the third side surface are adjacent each other, the first impurity region is formed in the semiconductor substrate close to the first side surface and covers the first bottom surface so as to pass under and not substantially contact the second side surface, the second impurity region is formed in the semiconductor substrate close to the fourth side surface and covers the second bottom surface so as to pass under and not substantially contact the third side surface, and the first impurity region and the second impurity region are separate apart from each other.

A semiconductor device according to other embodiment of the present invention includes: (a) preparing a semiconductor substrate of a first conductivity type having an upper surface and a bottom surface opposite to the upper surface; (b) forming a first ion-implantation layer and a second ion-implantation layer in the semiconductor substrate by performing a first ion-implantation; (c) by performing a first heat treatment for the semiconductor substrate, forming a first impurity region of a second conductivity type opposite to the first conductivity type by diffusing impurities included in the first ion-implantation layer and forming a second impurity region of the second conductivity type by diffusing impurities included in the second ion-implantation layer; (d) forming a first trench and a second trench on the upper surface of the semiconductor substrate; (e) forming a first gate insulating film on a side surface of the first trench and forming a second gate insulating film on a side surface of the second trench; and (f) forming a first gate electrode so as to fill in the first trench via the first gate insulating film and forming a second gate electrode so as to fill in the second trench via the second gate insulating film. And the first trench has a first side surface, a second side surface facing to the first side surface and a first bottom surface connecting the first side surface and the second side surface, the second trench has a third side surface, a fourth side surface facing to the third side surface and a second bottom surface connecting the third side surface and the fourth side surface, the first trench and the second trench are separate apart from so as to the second side surface and the third side surface are adjacent each other, the first impurity region is formed in the semiconductor substrate close to the first side surface and covers the first bottom surface so as to pass under and not substantially contact the second side surface, the second impurity region is formed in the semiconductor substrate close to the fourth side surface and covers the second bottom surface so as to pass under and not substantially contact the third side surface, and the first impurity region and the second impurity region are separate apart from each other.

According to embodiments, the performance of semiconductor device can be improved, and a decrease in yield can be suppressed.

BRIEF DESCRIPTION OF THE DRAWINGS

FIG. 1 is a plan view showing a semiconductor device according to a first embodiment.

FIG. 3 is a cross-sectional view along line A-A shown in FIG. 2 according to the first embodiment.

FIG. 4 is a main portion cross-sectional view corresponding to a region 2A shown in FIG. 1 according to the first embodiment.

FIG. 6 is a cross-sectional view showing a step performed after the step shown in FIG. 5 according to the first embodiment.

FIG. 8 is a cross-sectional view showing a step performed after the step shown in FIG. 7 according to the first embodiment.

FIG. 15 is a cross-sectional view showing a step performed after the step shown in FIG. 14 according to the first embodiment.

DETAILED DESCRIPTION

Figure 2:
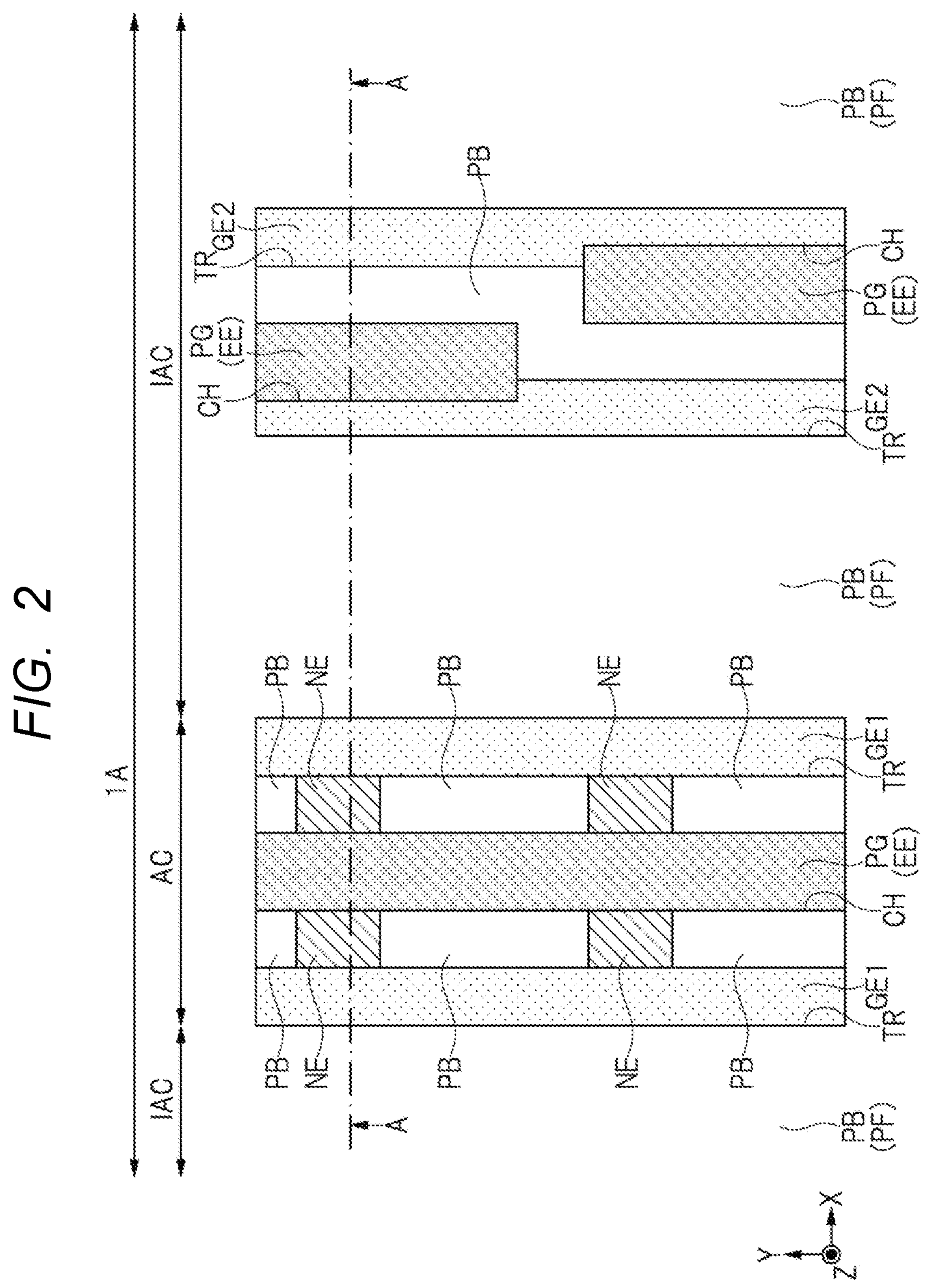
FIG. 2 is a main portion plan view showing the semiconductor device according to the first embodiment.

In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, the X direction, the Y direction, and the Z direction described in the present application intersect each other and are orthogonal to each other. In the present application, the Z direction is described as a vertical direction, a height direction, or a thickness direction of a certain structure. In addition, the expression "plan view" used in the present application means that the plane formed by the X direction and the Y direction is a "plane" and the "plane" is viewed from the Z direction.

First Embodiment (Structure of Semiconductor Device)

Figure 1:
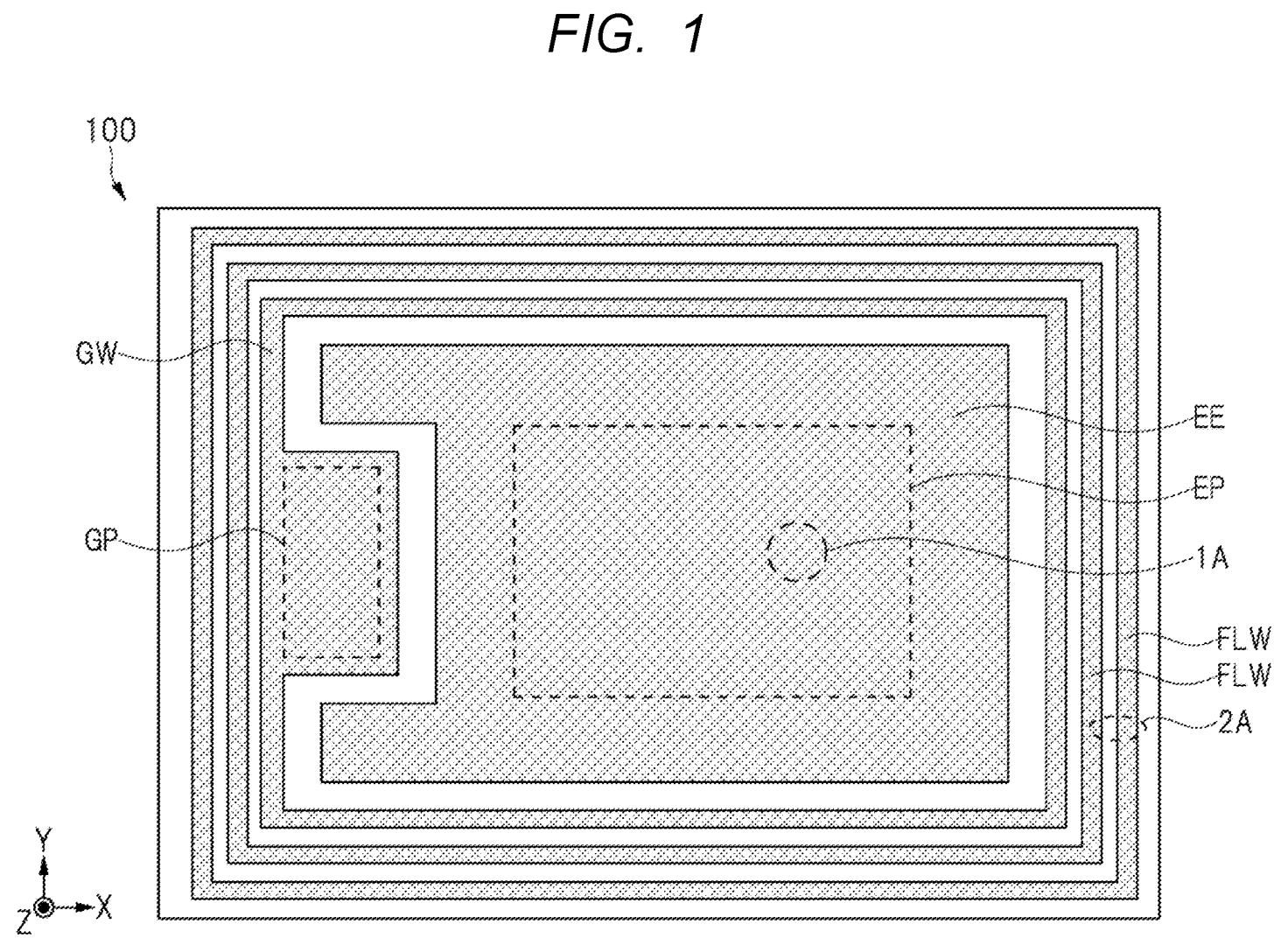

A structure of a semiconductor device 100 in a first embodiment will be described below with reference to FIG. 1 to FIG. 4. Main features of the first embodiment are structure of a p-type floating region FP and a hole barrier region and the manufacturing process thereof. Such features are described in detail below.

FIG. 1 is a plan view showing a semiconductor chip which is the semiconductor device 100. As shown in FIG. 1, a majority of the semiconductor device 100 is covered with an emitter electrode EE. A gate wiring GW is formed so as to surround the emitter electrode EE in a plan view. A field limiting wiring FLW is formed so as to surround the gate wiring GW in a plan view. Here, although two field limiting wirings FLW are exemplified, the number of the field limiting wiring FLW may be at least one or more, and may be three or more.

Although not illustrated here, the emitter electrode EE, the gate wiring GW and the field limiting wiring FLW are covered with a protective film such as a polyimide film. On the emitter electrode EE and the gate wiring GW, openings are provided in parts of the protective film, and regions exposed in the openings become an emitter pad EP and a gate pad GP. An external connecting member such as a bonding wire or a clip (copper plate) is connected to the emitter pad EP and the gate pad GP, so that the semiconductor device 100 is electrically connected to another semiconductor chip or a wiring substrate.

The semiconductor device 100 comprises a cell region and an outer peripheral region surrounding the cell region. In the cell region, a main semiconductor device such as an IGBT is formed. The gate wiring GW and the field limiting wiring FLW are formed in the outer peripheral region. A region 1A shown in FIG. 1 indicates a portion of the cell region, and a region 2A indicates a portion of the outer peripheral region.

FIG. 2 is a main portion plan view corresponding to the region 1A shown in FIG. 1. The IGBT shown in FIG. 2 is the IE effect based the GGEE structure. The semiconductor device 100 has an active cell AC for performing main operation of the IGBT and an inactive cell IAC other than the active cell AC.

As shown in FIG. 2, a plurality of trenches TR extend in a Y direction and adjoin each other in a X direction. A gate electrode GE1 is formed in the trench TR of the active cell AC. A gate electrode GE2 is formed inside the trench TR of the inactive cell IAC. The gate wiring GW is electrically connected to the gate electrode GE1 of the active cell AC, and a gate potential is supplied when the IGBT is operated. The emitter electrode EE is electrically connected to the gate electrode GE2 of the inactive cell IAC, and an emitter potential is supplied when the IGBT is operated. In addition, a base region PB and an emitter region NE of the active cell AC are electrically connected to the base region PB of the inactive cell IAC, and the emitter potential is supplied to the emitter electrode EE when the IGBT is operated.

Figure 3:
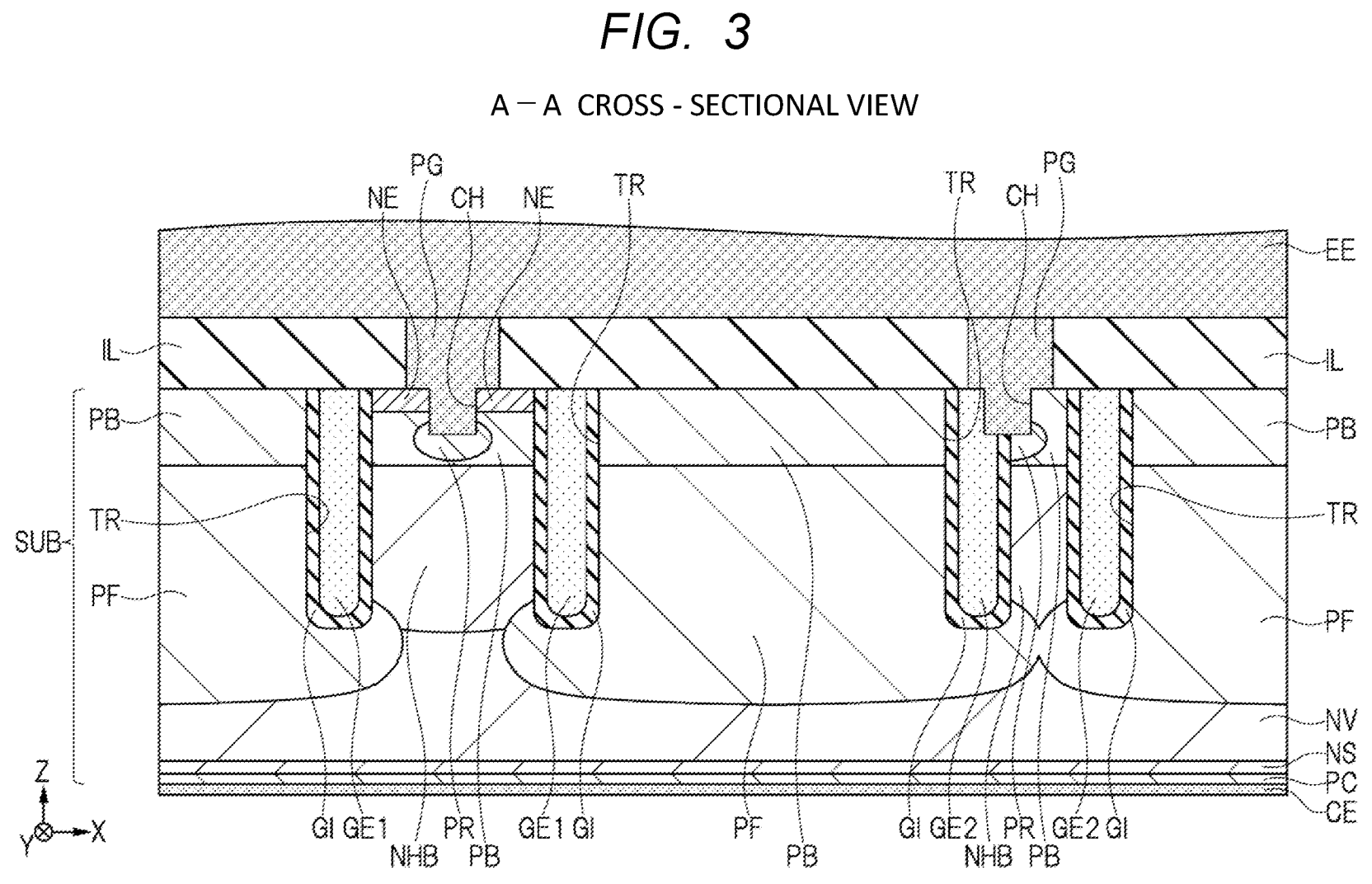

FIG. 3 is a cross-sectional view along line A-A shown in FIG. 2. The semiconductor device 100 comprises an n-type semiconductor substrate SUB having an upper surface and a bottom surface. The semiconductor substrate SUB has an n-type drift region NV. Here, the n-type semiconductor substrate SUB itself constitute the drift region NV. The drift region NV may be a laminate of the n-type silicon substrate SUB and a semiconductor layer grown by introducing phosphorus (P) on the silicon substrate SUB by epitaxial growth method. In this embodiment, such laminates are also described as being the semiconductor substrate SUB.

In the semiconductor substrate SUB, an n-type field stop region (impurity region) NS is formed close to the bottom surface of the semiconductor substrate SUB. An impurity concentration of the field stop region NS is higher than an impurity concentration of the drift region NV. The field stop region NS is provided to prevent a depletion layer extending from a pn junction close to the upper surface of the semiconductor substrate SUB from reaching a p-type collector region PC when the IGBT is turned off.

The p-type collector region (impurity region) PC is formed in the semiconductor substrate SUB close to the bottom surface of the semiconductor substrate SUB. The collector region PC is located below the field stop region NS.

A collector electrode CE is formed on the bottom surface of the semiconductor substrate SUB. The collector electrode CE is electrically connected to the collector region PC and supplies a collector potential to the collector region PC. The collector electrode CE is, for example, a single-layer metal film such as Au film, Ni film, Ti film, or AlSi film, or a laminated metal film obtained by laminating these layers as appropriate.

In the semiconductor substrate SUB at the upper surface of the semiconductor substrate SUB, the trench TR is formed. The trench TR penetrates through the emitter region NE and the base region PB, which will be described later, and reaches the semiconductor substrate SUB. The depth of the trench TR is, for example, 2 micrometers or more and 5 micrometers or less.

A gate insulating film GI is formed inside the trench TR. The gate electrodes GE1 and GE2 are embedded in the trench TR through the gate insulating film GI. The gate insulating film GI is an insulating film, and is, for example, a silicon oxide film. The gate electrodes GE1 and GE2 is a conductive film, for example, a doped-polysilicon film which is n-type impurities are introduced. A thickness of the gate insulating film GI is, for example, greater than or equal to 70 nanometers and less than or equal to 150 nanometers.

At the active cell AC close to the upper surface of the semiconductor substrate SUB, the hole barrier region (impurity region) NHB is formed in the semiconductor substrate SUB between the pair of the trench TR (a pair of the gate electrodes GE1). An impurity concentration of the hole barrier region NHB is higher than the impurity concentration of the drift region NV.

In the hole barrier region NHB, the p-type base region (impurity region) PB is formed. And, the n-type emitter region (impurity region) NE is formed in the p-type base region PB. An impurity concentration of the emitter region NE is higher than the impurity concentration of the drift region NV. And the base region PB is formed to be shallower than the depth of the trench TR, and the emitter region NE is formed to be shallower than the depth of the base region PB.

At the inactive cell IAC close to the upper surface of the semiconductor substrate SUB, the hole barrier region NHB is formed in the semiconductor substrate SUB between the pair of the trench TR (a pair of the gate electrodes GE2). And the p-type floating region (impurity region) PF is formed in the semiconductor substrate SUB between the gate electrode GE1 and the gate electrode GE2. And the p-type base region PB is formed in the hole barrier region NHB and the floating region PF. An impurity concentration of the base region PB is higher than an impurity concentration of the floating region PF.

The floating region PF and the base region PB formed in the floating region PF are not electrically connected to the gate wiring GW and the emitter electrode EE, and no potential is supplied thereto. In order to improve a junction breakdown voltage, the floating region PF is formed to a position deeper than a bottom of the trench TR and is formed so as to cover the bottom of the trench TR.

An interlayer insulating film IL is formed on the upper surface of the semiconductor substrate SUB so as to cover the trench TR. The interlayer insulating film IL is, for example, the silicon oxide film. A thickness of the interlayer insulating film IL is, for example, 600 nanometers or more and 1500 nanometers or less.

In the active cell AC, a contact hole CH penetrates through the interlayer insulating film IL and the emitter region NE, and reaches the base region PB. The contact hole CH is formed so as to be in contact with the emitter region NE and the base region PB.

At an upper of the contact hole CH, the interlayer insulating film IL is retracted. That is, a size of an opening of the contact hole CH located above the upper surface of the semiconductor substrate SUB is larger than a size of the opening of the contact hole CH located below the upper surface of the semiconductor substrate SUB. Therefore, a part of the upper surface of the emitter region NE is exposed from the interlayer insulating film IL. Thus, the emitter electrode EE contacts not only a side surface of the emitter region NE but also the part of the upper surface of the emitter region NE inside the contact hole CH. Accordingly, a contact-resistance between the emitter electrode EE and the emitter region NE can be reduced.

In the inactive cell IAC, the contact hole CH penetrates through the interlayer insulating film IL and reaches the base region PB. The contact hole CH is formed so as to overlap the gate electrode GE2 in plan view. Therefore, the contact hole CH in the inactive cell IAC is formed so as to be in contact with the gate electrode GE2 and the base region PB.

In the active cell AC and the inactive cell IAC, a p-type high-concentration diffused region (impurity region) PR is formed in the base region PB around a bottom of the contact hole CH. An impurity concentration of the high-concentration diffused region PR is higher than the impurity concentration of the base region PB. The high-concentration diffused region PR is provided in order to lower the contact-resistance with the emitter electrode EE and prevent latch-up.

A plug PG is filled in the contact hole CH. The plug PG includes a barrier metal film and a conductive film formed on the barrier metal film. The barrier metal film is, for example, a laminated film of a titanium film and a titanium nitride film formed on the titanium film. The conductive film is, for example, a tungsten film.

Although not shown here, the contact hole CH is also formed on a part of the gate electrode GE1, and the plug PG is also formed inside the contact hole CH.

The emitter electrode EE is formed on the interlayer insulating film IL. The emitter electrode EE is electrically connected to the emitter region NE, the base region PB, the high-concentration diffused region PR, and the gate electrode GE2 via the plug PG, and supplies the emitter potential to these regions.

Note that, although not shown here, the gate wiring GW formed in the same manufacturing process as the emitter electrode EE is also formed on the interlayer insulating film IL. The gate wiring GW is electrically connected to the gate electrode GE1 via the plug PG and supplies the gate potential to the gate electrode GE1. The emitter electrode EE and the gate wiring GW include, for example, TiW film and aluminum film formed on TiW film. Aluminum film is a main conductive film of the emitter electrode EE and the gate wiring GW, and is sufficiently thicker than TiW film.

Figure 4:
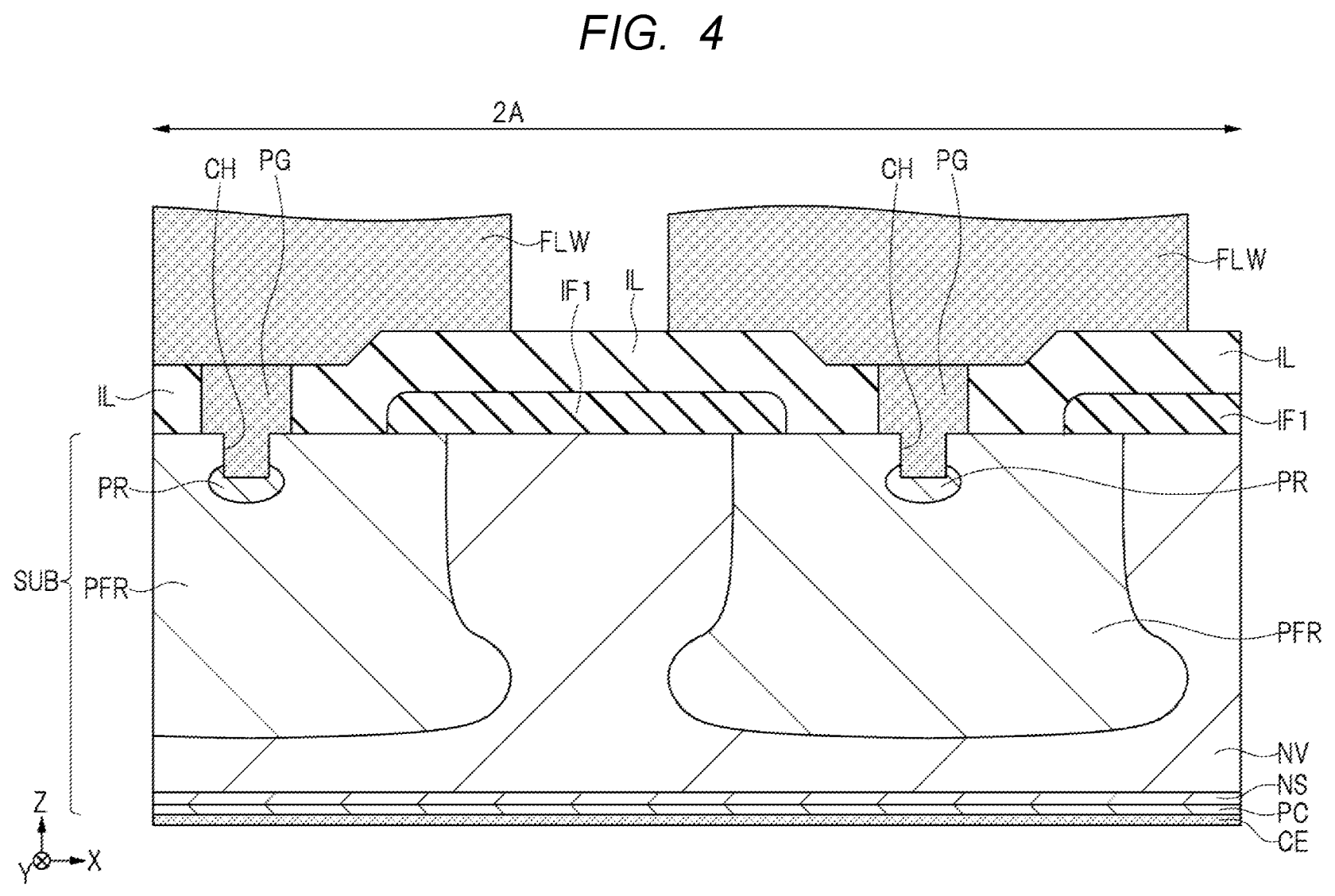

FIG. 4 is a main portion cross-sectional view corresponding to the region 2A shown in FIG. 1. In the semiconductor substrate SUB of the outer peripheral region at the upper surface of the semiconductor substrate SUB, a p-type field limiting region PFR is formed. The field limiting region PFR is an impurity region formed in the same manufacturing process as the floating region PF.

An insulating film IF1 is formed on the upper surface of the semiconductor substrate SUB of the outer peripheral region so as to straddle the respective field limiting regions PFR. The insulating film IF1 is an insulating film, and is, for example, the silicon oxide film. A thickness of the insulating film IF1 is, for example, 200 nanometers or more and 300 nanometers or less.

The interlayer insulating film IL is formed on the field limiting region PFR and on the insulating film IF1. The contact hole CH penetrates trough the interlayer insulating film IL and reaches the field limiting region PFR. The high-concentration diffused region PR is formed in the field limiting region PFR around the bottom of the contact hole CH. The plug PG is also formed inside the contact hole CH. The field limiting wiring FLW formed in the same manufacturing process as the emitter electrode EE and the gate wiring GW are formed on the interlayer insulating film IL.

The field limiting wiring FLW is electrically connected to the field limiting region PFR via the plug PG. The field limiting wiring FLW and the field limiting region PFR are not electrically connected to the emitter electrode EE and the gate wiring GW and are floating.

Since the field limiting region PFR is provided, the depletion layer is extended from the cell region toward the outer peripheral region, so that a high electric field generated in association with a high voltage applied to the IGBT of the cell region can be relaxed. Further, in plan view, the field limiting wiring FLW covers not only the field limiting region PFR but also the border between the field limiting region PFR and the drift region NV. Accordingly, the electric field generated at the boundary is also relaxed.

(Manufacturing Method of the Semiconductor Device)

Respective manufacturing steps included in the semiconductor device 100 manufacturing method in the first embodiment will be described below with reference to FIGS. 5 to 15.

Figure 5:
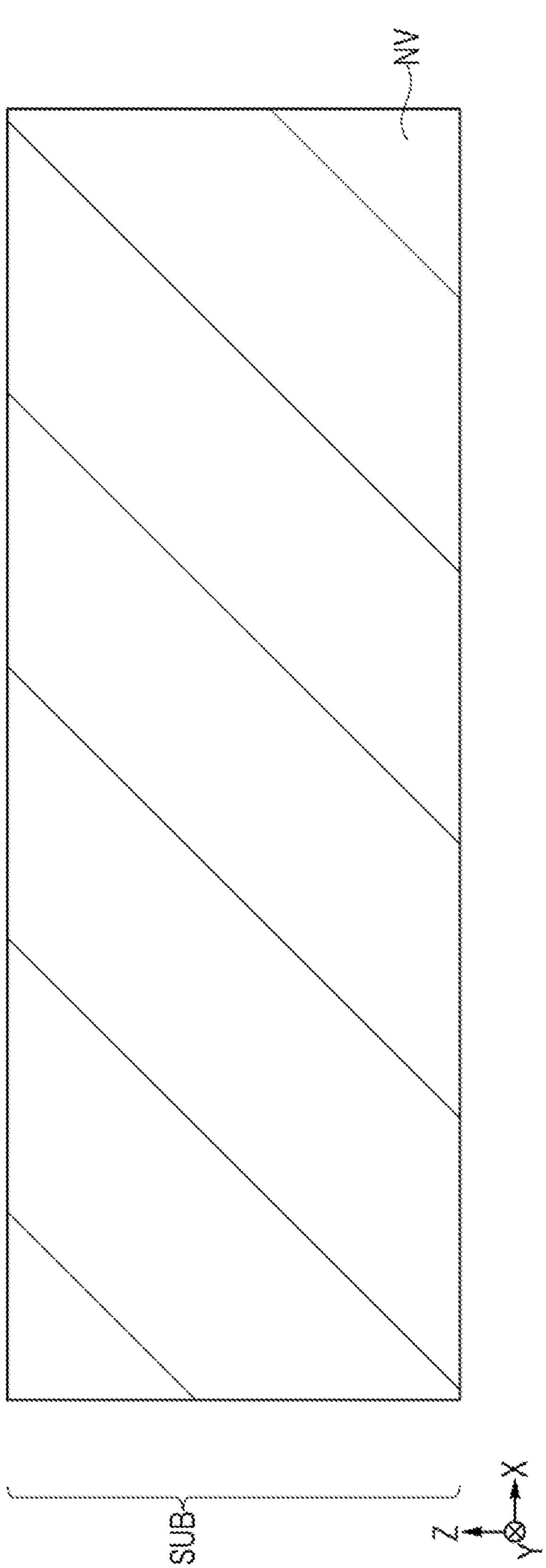
FIG. 5 is a cross-sectional view showing a step of a manufacturing method of the semiconductor device according to the first embodiment.

As shown in FIG. 5, first, the n-type semiconductor substrate SUB having the upper surface and a lower surface is prepared. As described above, the n-type semiconductor substrate SUB itself constitute the drift region NV, but the drift region NV may be an n-type semiconductor layer grown on the n-type silicon substrate while introducing phosphorus (P) by epitaxial growth method.

Thereafter, although not shown here, the insulating film IF1 shown in FIG. 4 is formed. The insulating film IF1 made of the silicon oxide film is formed on the upper surface of the semiconductor substrate SUB by, for example, thermal oxidation method. Next, a resist pattern having an opening is formed on the insulating film IF1. Next, anisotropic etching is performed using the resist pattern as a mask to remove the insulating film IF1 exposed at the opening, thereby exposing the upper surface of the semiconductor substrate SUB. Next, the resist pattern is removed by ashing. By patterning the insulating film IF1 in this manner, as shown in FIG. 4, the insulating film IF1 is selectively formed on the upper surface of the semiconductor substrate SUB.

Figure 6:
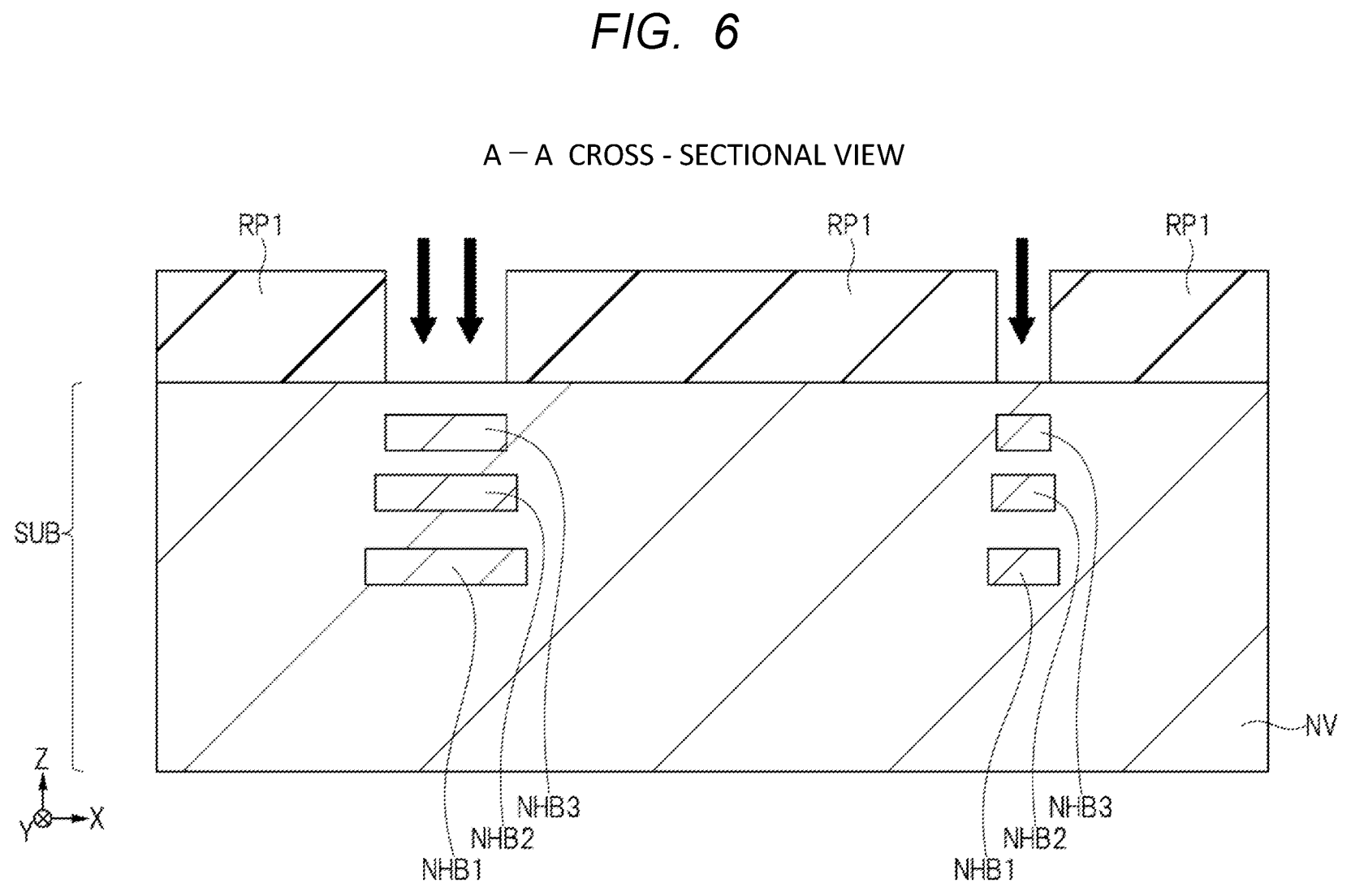

As shown in FIG. 6, first, a resist pattern RP1 is formed on the upper surface of the semiconductor substrate SUB. The resist pattern RP1 has a pattern for opening a region which becomes the hole barrier region NHB of each of the active cell AC and the inactive cell IAC later. Next, using the resist pattern RP1 as a mask, n-type ion-implantation is performed a plurality of times from the upper surface of the semiconductor substrate SUB. In this example, three times of n-type ion-implantation are performed. After the third n-type ion-implantation, the resist pattern RP1 is removed by ashing.

A first n-type ion-implantation is performed under the condition that ionic species is phosphorus (P), implantation energy is about 1000 keV, and dose amount is about $3.0\times10^{12}$ $cm^{-2}$. As a result, an ion-implantation layer NHB1 is formed in the semiconductor substrate SUB.

A second n-type ion-implantation is performed under the condition that ionic species is phosphorus (P), implantation energy is about 600 keV, and dose amount is about $3.0\times10^{12}$ $cm^{-2}$. As a result, an ion-implantation layer NHB2 is formed in the semiconductor substrate SUB. The ion-implantation layer NHB2 is formed in the semiconductor substrate SUB overlapping with the ion-implantation layer NHB1 in plan view, and is located above the ion-implantation layer NHB1.

The third n-type ion-implantation is performed under the condition that ionic species is phosphorus (P), implantation energy is about 300 keV, and dose amount is about $4.0\times10^{12}$ $cm^{-2}$. As a result, the ion-implantation layer NHB3 is formed in the semiconductor substrate SUB. The ion-implantation layer NHB3 is formed in the semiconductor substrate SUB overlapping with the ion-implantation layer NHB2 in plan view, and is located above the ion-implantation layer NHB2.

Here, ion-implantation layers are formed at the deeper position as the energy is increased, however when ion-implantation is performed, a crystal dislocation defects are generated in the semiconductor substrate SUB. When the ion-implantation layers are formed in order from a shallow position, there is a possibility that an impurity profile is disturbed by the crystal dislocation defects occurring in the shallow position when ion-implantation is performed to the deep position. Therefore, it is preferable to perform ion-implantation to a deeper position first.

That is, although the energies of the first to third n-type ion-implantation are different from each other, it is preferable to perform an n-type ion-implantation having a large energy first. Therefore, it is preferable to first perform the first n-type ion-implantation, then perform the second n-type ion-implantation, and then perform the third n-type ion-implantation.

And the first to third n-type ion-implantation are performed from an angle perpendicular to the upper surface of the semiconductor substrate SUB. Ion-implantation to deep locations increases the possibility that the ions will collide with each other and be scattered. Therefore, the ion-implantation layers formed at the deeper position easily spread to the lateral direction. Therefore, a width of the ion-implantation layer NHB1 is wider than a width of the ion-implantation layer NHB2, and the width of the ion-implantation layer NHB2 is wider than a width of the ion-implantation layer NHB3.

Figure 7:
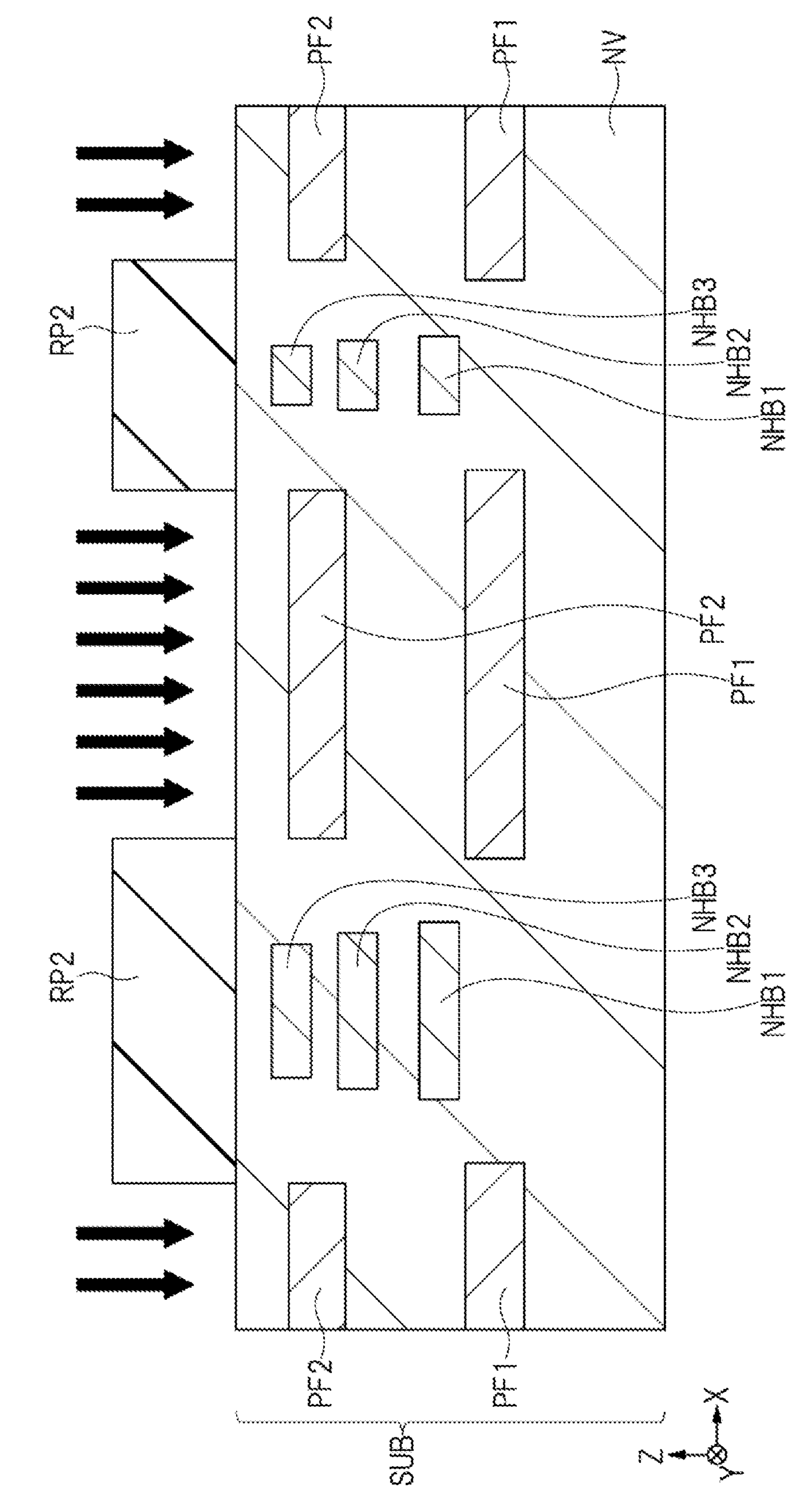
FIG. 7 is a cross-sectional view showing a step performed after the step shown in FIG. 6 according to the first embodiment.

As shown in FIG. 7, first, a resist pattern RP2 is formed on the upper surface of the semiconductor substrate SUB. The resist pattern RP2 has a pattern for opening a region which becomes the floating region FP later. Next, using the resist pattern RP2 as a mask, a plurality of p-type ion-implantation are performed from the upper surface of the semiconductor substrate SUB. Here, the case where of performing two times p-type ion-implantation is exemplified. After second p-type ion-implantation is performed, the resist pattern RP2 is removed by ashing.

A first p-type ion-implantation is performed under the condition that ionic species is boron (B), implantation energy is about 1250 keV, and dose amount is about $6.0\times10^{12}$ $cm^{-2}$. As a result, the ion-implantation layer PF1 is formed in the semiconductor substrate SUB.

A second p-type ion-implantation is performed under the condition that ionic species is boron (B), implantation energy is about 300 keV, and dose amount is about $1.6\times10^{13}$ $cm^{-2}$. As a result, the ion-implantation layer PF2 is formed in the semiconductor substrate SUB.

The ion-implantation layer PF2 is formed in the semiconductor substrate SUB overlapping with the ion-implantation layer PF1 in plan view, and is located above the ion-implantation layer PF1.

Again, although the energies of the first and second p-type ion-implantation are different, it is preferable to perform the p-type ion-implantation with a large energy first for the same reason as the first to third n-type ion-implantation. Therefore, it is preferable to first perform the first p-type ion-implantation and then perform the second p-type ion-implantation. The first and second p-type ion-implantation are also performed from an angle perpendicular to the upper surface of the semiconductor substrate SUB. For the same reason as the width relation of each the ion-implantation layers NHB1 to NHB3, a width of the ion-implantation layer PF1 is wider than a width of the ion-implantation layer PF2.

Note that manufacturing steps of forming the ion-implantation layers PF1 and PF2 may be performed before the manufacturing steps of forming the ion-implantation layers NHB1 to NHB3.

Figure 8:
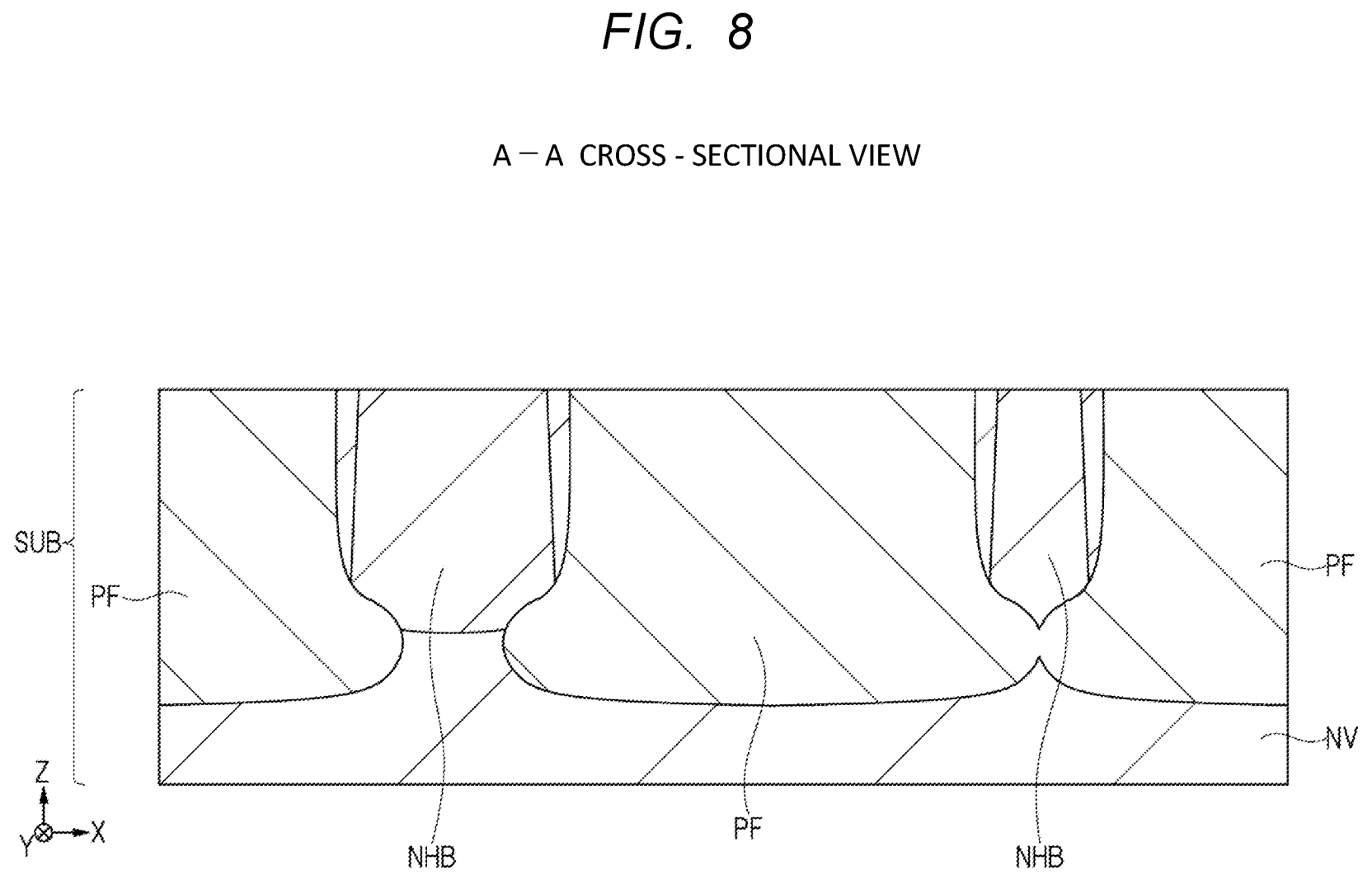

As shown in FIG. 8, after the ion-implantation layers NHB1 to NHB3 and the ion-implantation layers PF1 and PF2 are formed, a heat treatment is performed for the semiconductor substrate SUB. This heat treatment is performed, for example, in an atmosphere filled with an inert gas such as nitrogen gas, and at a temperature of degree Celsius or more and 900 degree Celsius or less and a process time of 30 seconds or more and 150 seconds or less.

By this heat treatment, impurities (B) contained in each of the ion-implantation layers PF1 and PF2 are diffused to form the p-type floating region PF. By this heat treatment, impurities (P) contained in each of the ion-implantation layers NHB1 to NHB3 are diffused to form the n-type hole barrier region NHB. In addition, by this heat treatment, the crystal dislocation defects generated during ion-implantations are recovered.

Note that, the field limiting region PFR shown in FIG. 4 is formed by the same manufacturing process as the manufacturing process for forming the p-type floating region PF. That is, the ion-implantation layers PF1 and PF2 are also formed in the semiconductor substrate SUB of the outer peripheral region. Then, by the heat treatment, impurities (B) contained in each of the ion-implantation layers PF1 and PF2 are diffused to form the field limiting region PFR.

In the semiconductor substrate SUB at the upper surface of the semiconductor substrate SUB, the trench TR is formed. In order to form the trench TR, first, the silicon oxide film is formed on the upper surface of the semiconductor substrate SUB, for example, by CVD method. Next, a resist pattern having an opening is formed on the silicon oxide film. Next, the silicon oxide film is patterned by performing anisotropic etching by using the resist pattern as a mask to form a hard mask HM. Next, the resist pattern is removed by ashing. Next, an anisotropic etching is performed by using a hard mask HM as a mask to form the trench TR in the semiconductor substrate SUB. Thereafter, the hard mask HM is removed by, for example, a wet etching by using a hydrofluoric acid-containing solution.

Figure 9:
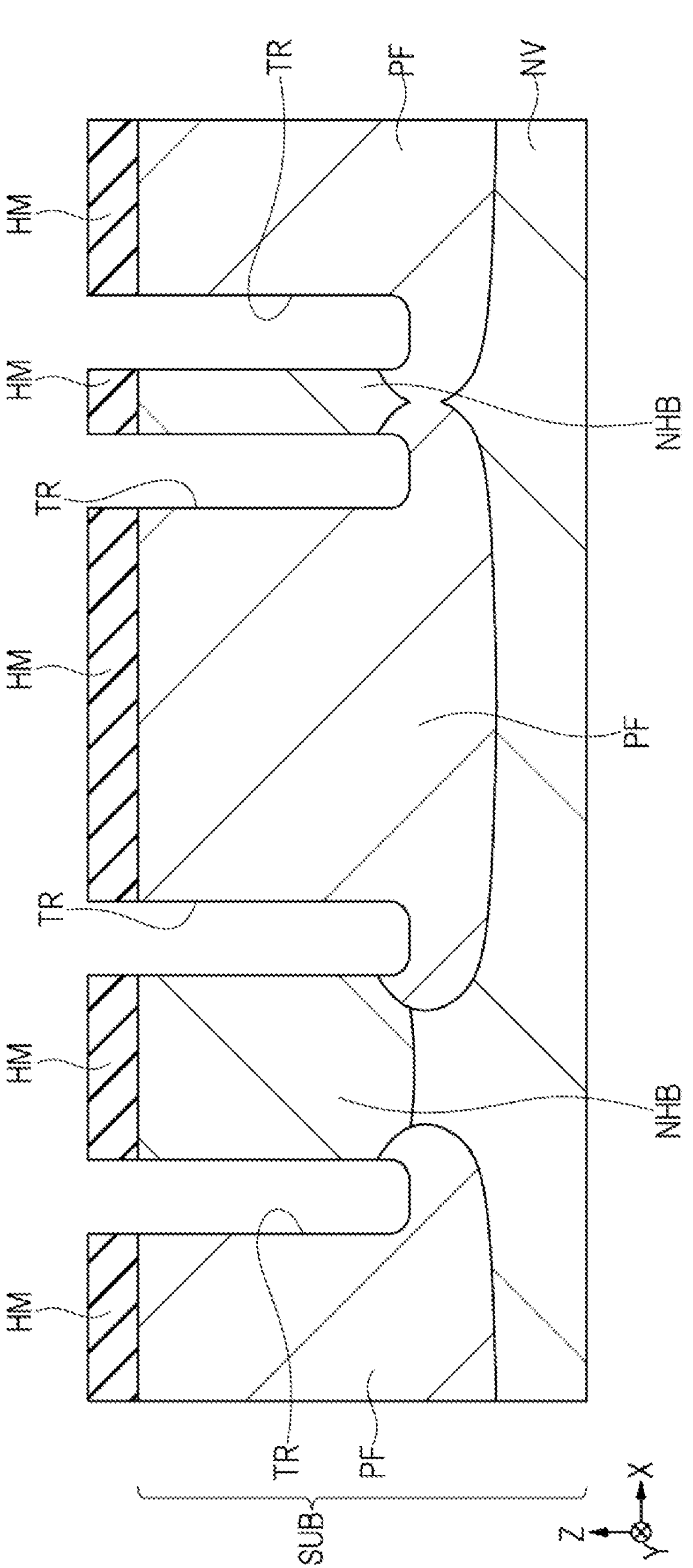
FIG. 9 is a cross-sectional view showing a step performed after the step shown in FIG. 8 according to the first embodiment.
Figure 10:
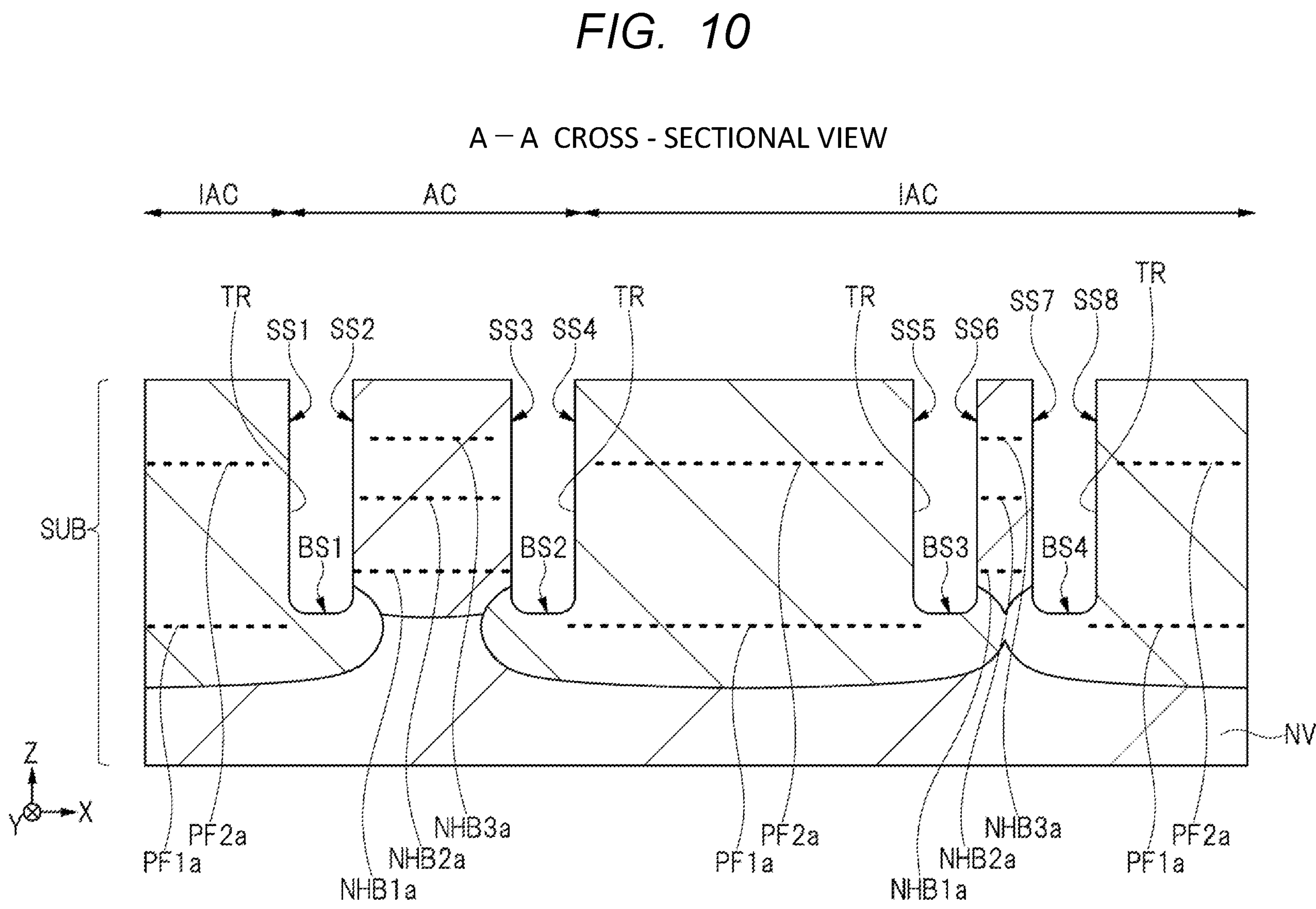
FIG. 10 is a cross-sectional view for explaining the configurations around a trench when the step shown in FIG. 9 is completed.

FIG. 10 is a cross-sectional view for explaining the configurations around the trench TR at the time when the manufacturing process of FIG. 9 is completed.

As shown in FIG. 10, of the pair of the trenches TR formed in the active cell AC, one of the trenches TR has a side surface SS1, a side surface SS2 facing to the side surface SS1, and a bottom surface BS1 connecting the side surface SS1 and the side surface SS2. The other of the trenches TR of the active cell AC has a side surface SS3, a side surface SS4 facing the side surface SS3, and a bottom surface BS2 connecting the side surface SS3 and the side surface SS4. The one trench TR and the other trench TR are provided apart from each other such that the side surface SS2 and the side surface SS3 are adjacent.

And of the pair of the trenches TR formed in the inactive cell IAC, one of the trenches TR has a side surface SS5, a side surface SS6 facing to the side surface SS5, and a bottom surface BS3 connecting the side surface SS5 and the side surface SS6. The other of the trenches TR of the inactive cell IAC has a side surface SS7, a side surface SS8 facing to the side surface SS7, and a bottom surface BS4 connecting the side surface SS7 and the side surface SS8. The one trench TR and the other trench TR are provided apart from each other such that the side surface SS6 and the side surface SS7 are adjacent. Note that a distance between the pair of the trenches TR of the inactive cell IAC is narrower than a distance between the pair of the trenches TR of the active cell AC.

In FIG. 10, the positions of impurity concentration peaks of the ion-implantation layers NHB1 to NHB3, and the ion-implantation layers PF1 and PF2 formed prior to the heat treatment are shown as impurity concentration peaks NHB1*a* to NHB3*a*, and impurity concentration peaks PF1*a* and PF2*a*.

In the first embodiment, the ion-implantation layers NHB1 to NHB3, and the ion-implantation layers PF1 and PF2 are formed by a plurality of ion-implantations in the vicinity of a region where the floating region PF and the hole barrier region NHB are to be formed at time before the heat treatment. In particular, the ion-implantation layer NHB1 and the ion-implantation layer PF1 are formed to a deep position in advance. For example, the trench TR is formed such that the position of the bottom surface BS1 to BS4 of the respective trenches TR is shallower than the position of the impurity concentration peak PF1*a*.

Conventionally, a heat treatment has been performed under conditions of the high temperature and the long-time (1200 degree Celsius, 30 minutes), but in the first embodiment, the heat treatment can be performed under conditions of the lower temperature and the shorter time. For example, the gate insulating film GI described later is formed by thermal oxidation method, but the heat treatment of the first embodiment is performed at the lower temperature and the shorter time than the heat treatment performed by thermal oxidation method. Therefore, occurring of slip in the furnace body can be suppressed, and the floating region PF and the position where the hole barrier region NHB is formed can be accurately adjusted. Also, the profile design of the impurity concentration can be easily performed. Therefore, a performance of the semiconductor device can be improved, and a decrease in yield can be suppressed.

Further, by forming the floating region PF by such a method, not only the floating region PF covers the bottom surface of the trench TR but also the floating region PF can be easily extended to the lateral direction (X-direction). By forming the floating region PF in this manner, a concentration of an electric field directly under the trench TR can be relaxed, and a junction breakdown voltage can be improved.

That is, the floating region PF formed in the semiconductor substrate SUB close to the side surface SS1 covers the bottom surface BS1 so as to pass under and not substantially contact the side surface SS2. The floating region PF formed in the semiconductor substrate SUB close to the side surface SS4 covers the bottom surface BS2 so as to pass under and not substantially contact the side surface SS3. The floating region PF (the floating region PF covering the bottom surfaces of the pair of the trenches TR in the active cell AC) are not contacted and are spaced apart from each other.

Further, the floating region PF formed in the semiconductor substrate SUB close to the side surface SS5 (between the side surface SS4 and the side surface SS5) covers the bottom surface BS3 so as to pass under and not substantially contact the side surface SS6. The floating region PF formed in the semiconductor substrate SUB close to the side surface SS8 covers the bottom surface BS4 so as to pass under and not substantially contact the side surface SS7. The floating region PF (the floating region PF covering the bottom surfaces of the pair of the trenches TR in the inactive cell IAC) are contacted with each other, but may be spaced apart from each other.

Note that the hole barrier region NHB in the active cell AC is formed in the semiconductor substrate SUB between the side surface SS2 and the side surface SS3, and the hole barrier region NHB in the inactive cell IAC is formed in the semiconductor substrate SUB between the side surface SS6 and the side surface SS7.

Figure 11:
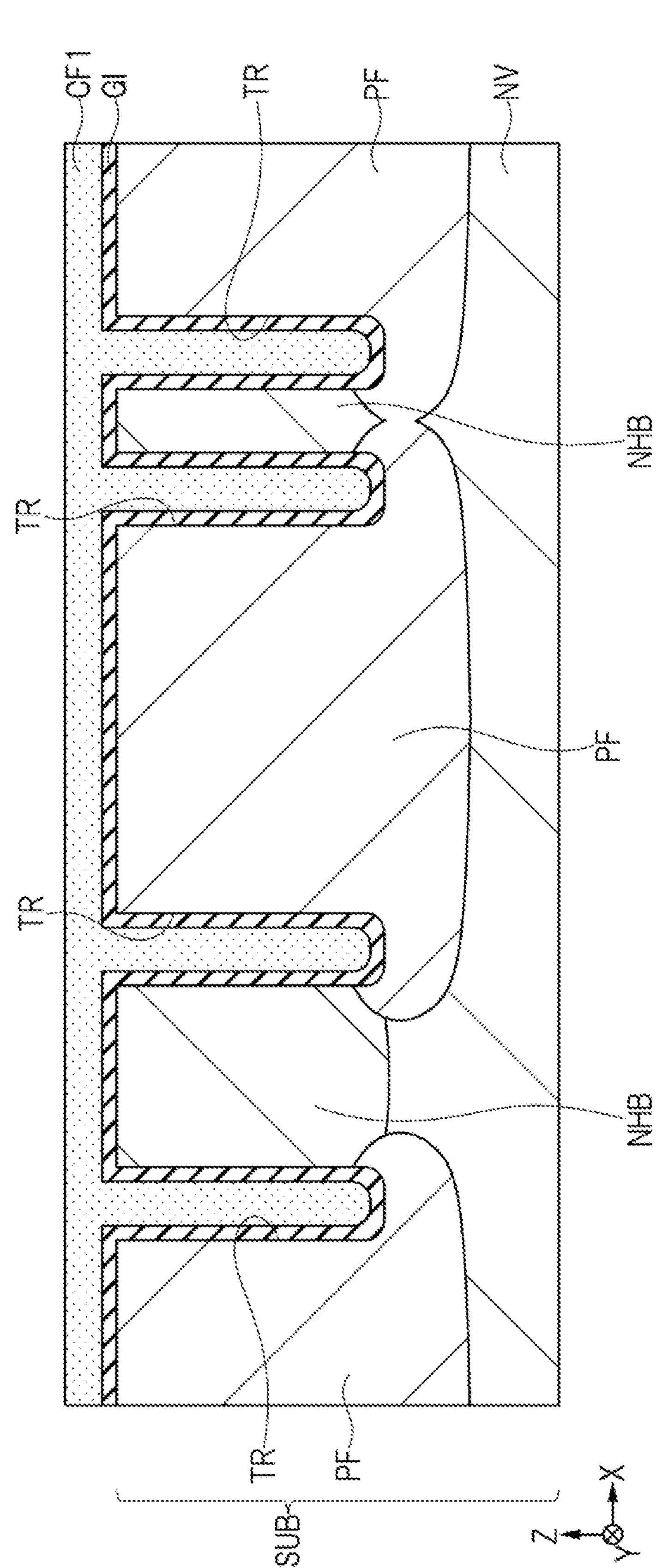
FIG. 11 is a cross-sectional view showing a step performed after the step shown in FIG. 9 according to the first embodiment.

FIG. 11 shows a manufacturing step performed after the step shown in FIG. 9. As shown in FIG. 11, first, the gate insulating film GI is formed on the side surface of the trench TR and on the upper surface of the semiconductor substrate SUB by thermal oxidation method. Specifically, the gate insulating film GI is the silicon oxide film formed by the heat treatment using oxygen gas and hydrogen gas under conditions of, for example, 950 degree Celsius and 40 minutes.

Next, the conductive film CF1 is formed inside of the trench TR and the upper surface of the semiconductor substrate SUB by, for example, CVD method so as to fill in the trench TR via the gate insulating film GI. The conductive film CF1 is, for example, the doped-polysilicon film in which n-type impurities are implanted.

Figure 12:
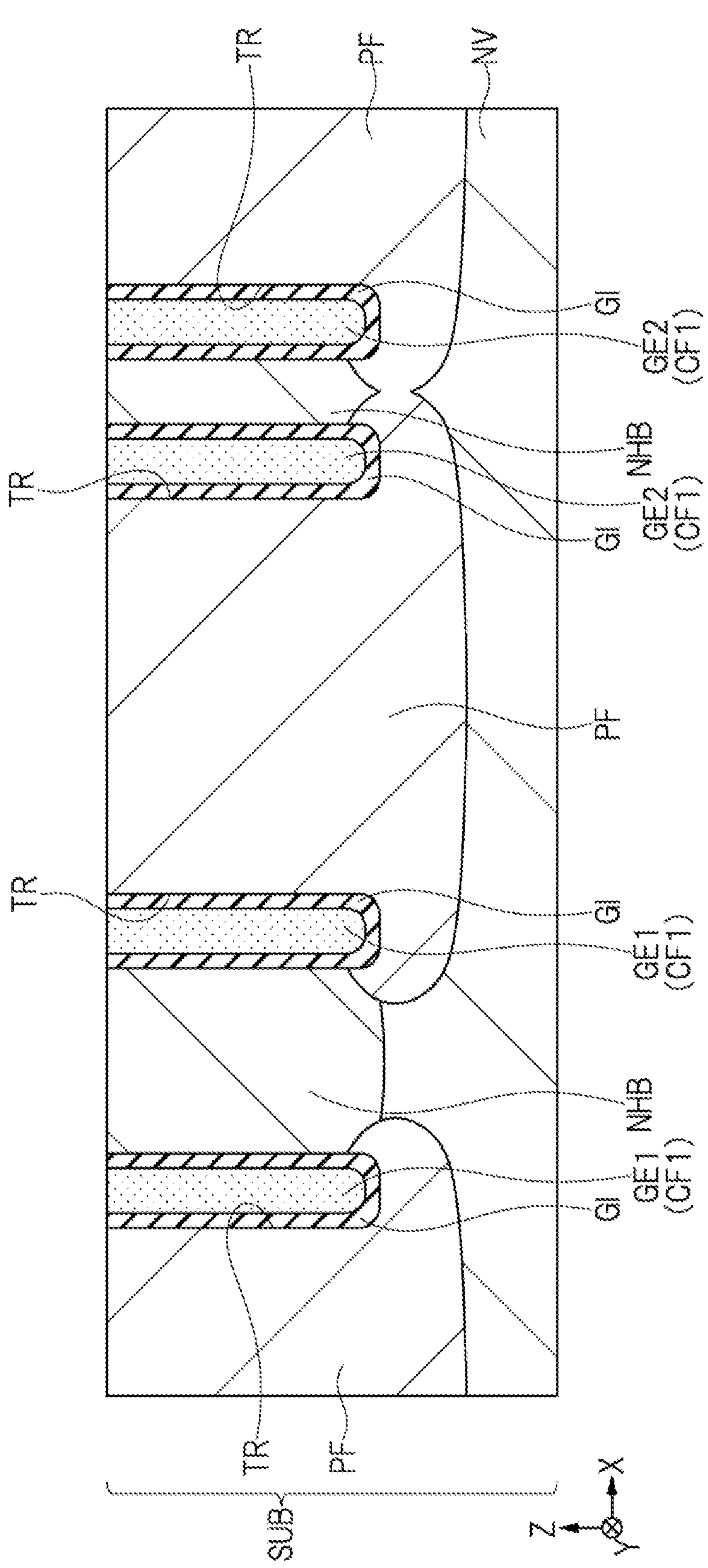
FIG. 12 is a cross-sectional view showing a step performed after the step shown in FIG. 11 according to the first embodiment.

As shown in FIG. 12, first, the conductive film CF1 formed outside the trench TR is removed by anisotropic etching. The conductive film CF1 formed inside the trench TR is left as the gate electrodes GE1 and GE2. Next, the gate insulating film GI formed outside the trench TR is removed by isotropic etching.

Figure 13:
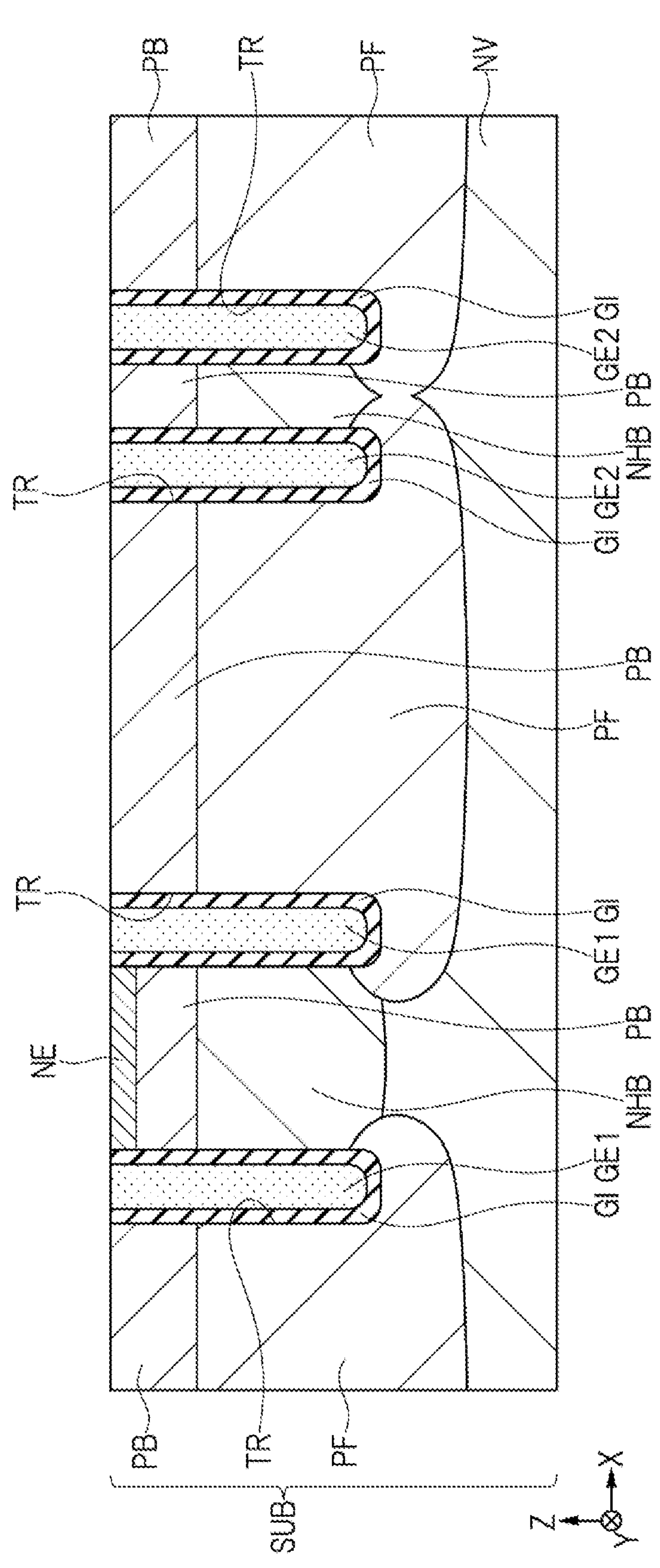
FIG. 13 is a cross-sectional view showing a step performed after the step shown in FIG. 12 according to the first embodiment.

As shown in FIG. 13, the p-type base region PB is formed in the semiconductor substrate SUB (in the floating region PF and in the hole barrier region NHB) close to the upper surface of the semiconductor substrate SUB by photolithography technique and ion-implantation method. Next, the n-type emitter region NE is selectively formed in the base region PB of the active cell AC by photolithography technique and ion-implantation method.

Although not shown, before these ion implantations are performed, an insulating film such as the silicon oxide film is formed on the upper surface of the semiconductor substrate SUB, and ion implantation may be performed using this insulating film as a through film. And the through film may be removed after ion-implantation or may be left as a part of the interlayer insulating film IL.

Figure 14:
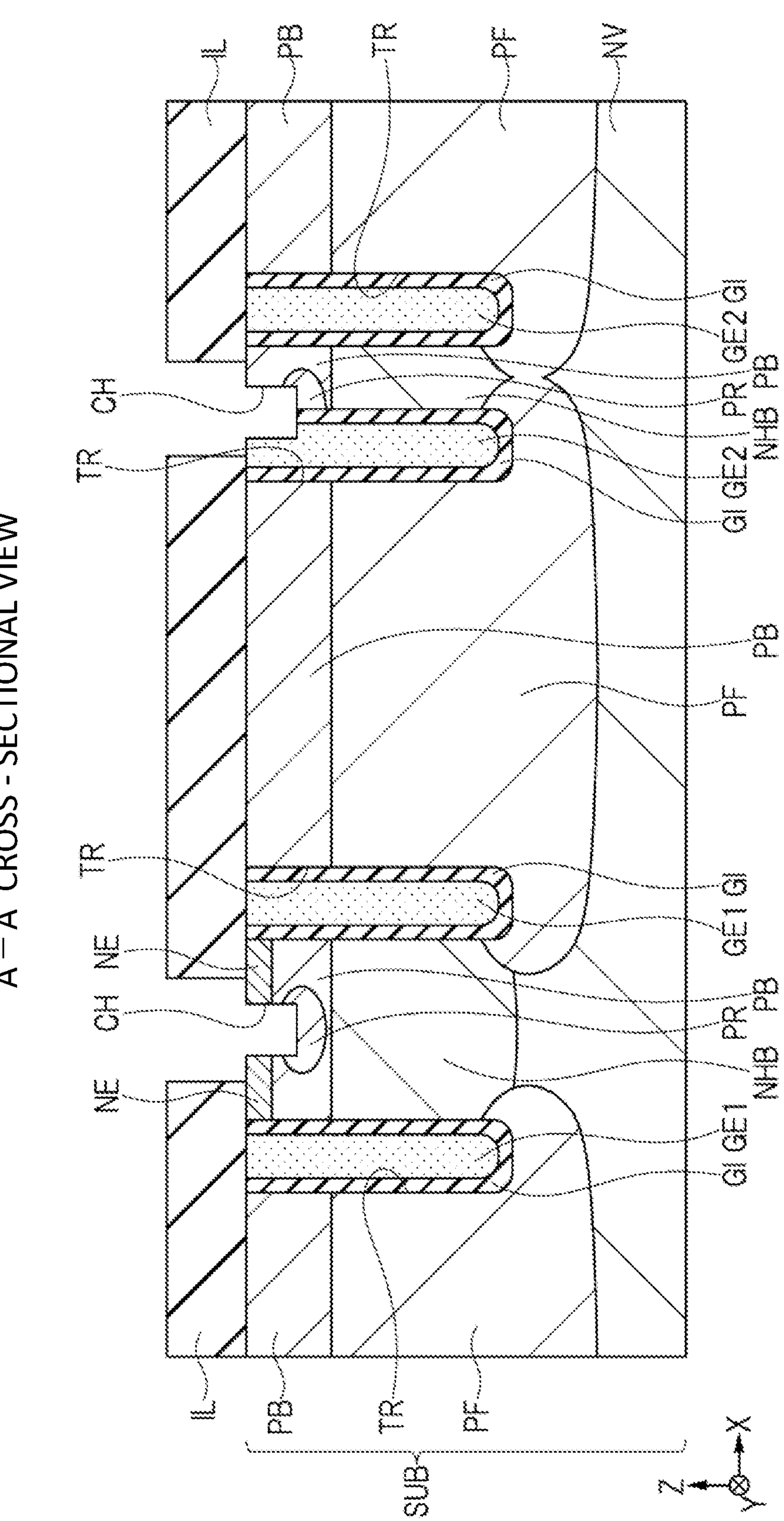
FIG. 14 is a cross-sectional view showing a step performed after the step shown in FIG. 13 according to the first embodiment.

As shown in FIG. 14, first, the interlayer insulating film IL is formed on the upper surface of the semiconductor substrate SUB by, for example, CVD method so as to cover the trench TR. The interlayer insulating film IL is, for example, the silicon oxide film.

Next, the contact hole CH is formed so as to penetrate through the interlayer insulating film IL and the emitter region NE and reach the base region PB in the active cell AC by photolithography technique and anisotropic etching. The bottom of the contact hole CH is located in the base region PB.

Here, the contact hole CH is also formed in the inactive cell IAC, and the contact hole CH is formed so as to overlap the gate electrode GE2 in plan view. Therefore, the contact hole CH in the inactive cell IAC is formed so as to be in contact with the gate electrode GE2 and the base region PB. Although not shown, the contact hole CH is also formed on a part of the gate electrode GE1.

Next, the high-concentration diffused region PR is formed in the base region PB at the bottom of the contact hole CH by photolithography technique and ion-implantation method. Next, isotropic etching is performed on the interlayer insulating film IL to retract the interlayer insulating film IL. As a result, a width of the contact hole CH located above the upper surface of the semiconductor substrate SUB is larger than a width of the contact hole CH located inside of the semiconductor substrate SUB.

Figure 15:
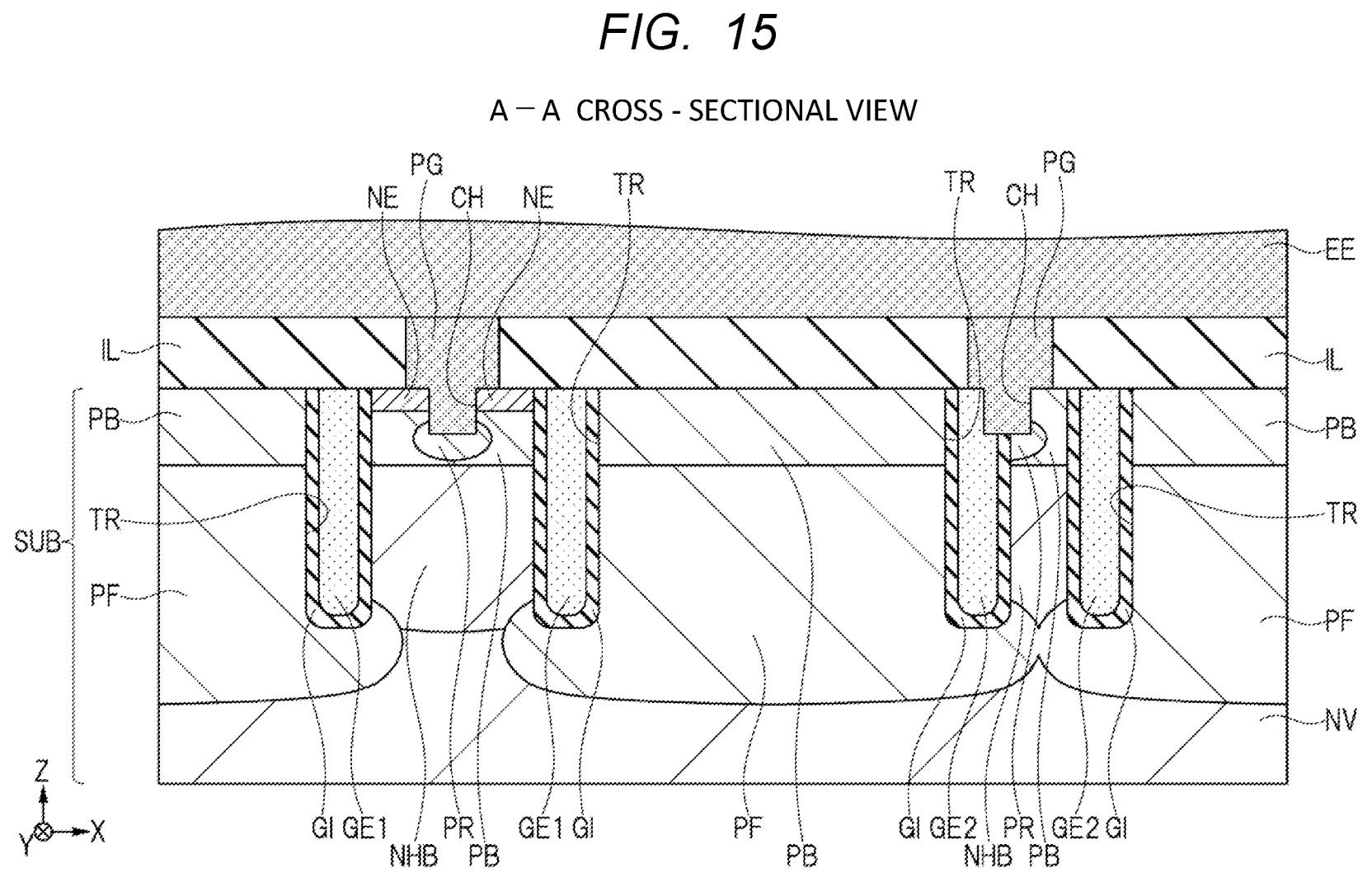

As shown in FIG. 15, the plug PG is formed inside the contact hole CH. First, the barrier metal film is formed inside the contact hole CH and on the interlayer insulating film IL. For example, the barrier metal film can be formed by forming a titanium film on the inside of the contact hole CH and on the interlayer insulating film IL by sputtering method, and by forming a titanium nitride film on the titanium film by, for example, sputtering method. Next, the conductive film made of, for example, a tungsten film is formed on the barrier metal film by, for example, CVD method so as to fill in the contact hole CH. Next, the conductive film and the barrier metal film formed outside of the contact hole CH are removed by anisotropic etching. As a result, the plug PG is formed so as to fill in the contact hole CH.

Next, the emitter electrode EE is formed on the interlayer insulating film IL. First, a TiW film is formed on the interlayer insulating film IL by, for example, sputtering method, and an aluminum film is formed on the TiW film by, for example, sputtering method. Next, the TiW film and the aluminum film are patterned by photolithography technique and dry etching to form the emitter electrode EE. Although not illustrated here, the gate wiring GW and the field limiting wiring FLW are also formed on the interlayer insulating film IL in the same step as the step of forming the emitter electrode EE.

Thereafter, the structure of FIG. 3 is obtained through the following manufacturing process. First, an ion-implantation is performed from the bottom surface of the semiconductor substrate SUB to form the n-type field stop region NS and the p-type collector region PC. After these ion-implantation, laser annealing is performed to activate impurities contained in the field stop region NS and the collector region PC. Next, a metal film such as an Au film, a Ni film, a Ti film, or a AlSi film is formed on the bottom surface of the semiconductor substrate SUB by, for example, sputtering method. This metal film becomes the collector electrode CE. The collector electrode CE may be a laminated film in which the above-described metal film is laminated appropriately.

Second Embodiment

A manufacturing method of a semiconductor device 100 in a second embodiment will be described below with reference to FIG. 16. Note that, in the following description, differences from the first embodiment will be mainly described, and the description of overlapping points with the first embodiment will be omitted.

In the first embodiment, a plurality of p-type ion-implantation are performed in order to form a p-type floating region PF. In the second embodiment, the floating region PF is formed by a single p-type ion-implantation. Therefore, the manufacturing process of FIG. 16 is performed instead of the manufacturing process of FIG. 7 of the first embodiment.

Figure 16:
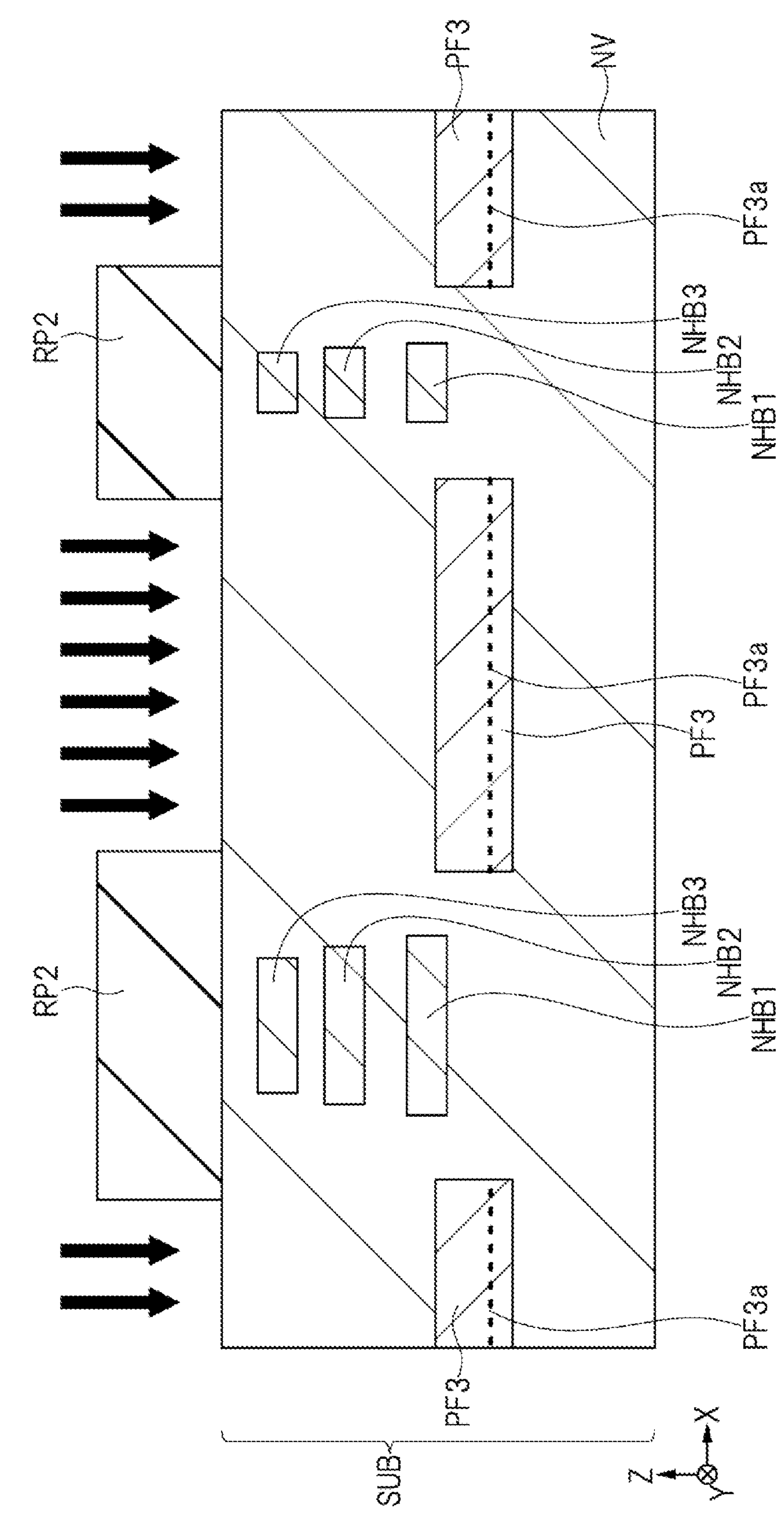
FIG. 16 is a cross-sectional view showing a step of a manufacturing method of the semiconductor device according to a second embodiment.

As shown in FIG. 16, the p-type ion-implantation is performed from an upper surface of the semiconductor substrate SUB using a resist pattern RP2 as a mask. The p-type ion-implantation is performed under the condition that ionic species is boron (B), implantation energy is about 1250 keV, and dose amount is about $2.2\times10^{13}$ $cm^{-2}$. As a result, an ion-implantation layer PF3 is formed in the semiconductor substrate SUB. The second embodiment has a higher dose amount than the first embodiment. Next, the resist pattern RP2 is removed by ashing.

Thereafter, by a heat treatment shown in FIG. 8, impurities (B) contained in the ion-implantation layer PF3 are diffused to form the p-type floating region PF. Note that, a field limiting region PFR shown in FIG. 4 is formed by the same manufacturing process as the manufacturing process for forming the floating region PF of the second embodiment.

The ion-implantation layer PF3 have an impurity concentration peak PF3*a*. In the second embodiment, similarly to the first embodiment, the trench TR is formed such that the position of bottom surfaces BS1 to BS4 of the respective trenches TR is shallower than the position of the impurity concentration peak PF3*a*. Since the ion-implantation layer PF3 is formed to a deep position in advance, the floating region PF can be formed even in the second embodiment by performing the heat treatment under conditions of the lower temperature and the shorter time. Therefore, occurring of slip in the furnace body can be suppressed, and the floating region PF and the position where the hole barrier region NHB is formed can be accurately adjusted.

In addition, even in the second embodiment, it is easy to achieve not only the floating region PF covers the bottom surface of the trench TR but also the floating region PF can be easily extended to the lateral direction (X-direction). As a result, a concentration of an electric field directly under the trench TR can be relaxed, and a junction breakdown voltage can be improved.

In the second embodiment, as compared with the first embodiment, the floating region PF is formed by smaller number of times of ion-implantation, so that a generation of crystal dislocation defects due to the p-type ion-implantation can be reduced. Further, it is possible to simplify the manufacturing process.

Although the present invention has been described in detail based on the embodiments, the present invention is not limited to these embodiments and can be variously modified without departing from the gist thereof.

What is claimed is:

1. A manufacturing method of a semiconductor device comprising the steps of:

(a) preparing a semiconductor substrate of a first conductivity type having an upper surface and a bottom surface opposite to the upper surface;

(b) after the step of (a), forming a first resist pattern on the upper surface of the semiconductor substrate;

(c) after the step of (b), forming a first ion-implantation layer and a second ion-implantation layer in the semiconductor substrate by performing a first ion-implantation with a first ion-implantation energy by using the first resist pattern as a mask;

(d) after the step of (c), forming a third ion-implantation layer at a position overlapping the first ion-implantation layer in the semiconductor substrate in plan view and forming a fourth ion-implantation layer at a position overlapping the second ion-implantation layer in the semiconductor substrate in plan view by performing a second ion-implantation with a second ion-implantation energy different of the first ion-implantation energy by using the first resist pattern as a mask;

(e) after the step of (d), removing the first resist pattern;

(f) after the step of (e), by performing a first heat treatment for the semiconductor substrate, forming a first impurity region of a second conductivity type opposite to the first conductivity type by diffusing impurities included in the first ion-implantation layer and the third ion-implantation layer and forming a second impurity region of the second conductivity type by diffusing impurities included in the second ion-implantation layer and the fourth ion-implantation layer;

(g) after the step of (f), forming a first trench and a second trench on the upper surface of the semiconductor substrate;

(h) after the step of (g), forming a first gate insulating film in the first trench and forming a second gate insulating film in the second trench; and (i) after the step of (h), forming a first gate electrode so as to fill in the first trench via the first gate insulating film and forming a second gate electrode so as to fill in the second trench via the second gate insulating film, wherein the first trench has a first side surface, a second side surface facing to the first side surface and a first bottom surface connecting the first side surface and the second side surface, the second trench has a third side surface, a fourth side surface facing to the third side surface and a second bottom surface connecting the third side surface and the fourth side surface, the first trench and the second trench are spaced apart such that the second side surface and the third side surface are adjacent each other, the first impurity region is formed in the semiconductor substrate close to the first side surface and covers the first bottom surface so as to pass under and not substantially contact the second side surface, the second impurity region is formed in the semiconductor substrate close to the fourth side surface and covers the second bottom surface so as to pass under and not substantially contact the third side surface, the first impurity region and the second impurity region are spaced apart from each other, the first ion-implantation energy is larger than the second ion-implantation energy, and in the step of (g), the first trench and the second trench are formed so that a position of each of the first bottom surface and the second bottom surface is shallower than peak positions of an impurity concentration of each of the first ion-implantation layer and the second ion-implantation layer.

2. The manufacturing method of the semiconductor device according to claim 1, wherein in the step of (h), a silicon oxide film is formed by thermal oxidation method, the first gate insulating film and the second gate insulating film are included the silicon oxide film, and in the step of (f), the first heat treatment is performed at lower temperature and shorter time than a heat treatment performed by thermal oxidation method.

3. The manufacturing method of the semiconductor device according to claim 1, wherein the first heat treatment is performed at a temperature of 700 to 900 degree Celsius with a process time of 30 to 150 seconds.

4. The manufacturing method of the semiconductor device according to claim 1, after the step of (a) before the step of (b) or after the step of (e) before the step of (f), (j1) forming a second resist pattern on the upper surface of the semiconductor substrate;

(j2) after the step of (j1), forming a fifth ion-implantation layer in the semiconductor substrate by performing a third ion-implantation with a third ion-implantation energy by using the second resist pattern as a mask;

(j3) after the step of (j2), forming a sixth ion-implantation layer at a position overlapping the fifth ion-implantation layer in the semiconductor substrate in plan view by performing a fourth ion-implantation with a fourth ion-implantation energy different of the third ion-implantation energy by using the first resist pattern as a mask; and (j4) after the step of (j3), removing the second resist pattern, wherein in the step of (f), by performing the first heat treatment for the semiconductor substrate, forming a third impurity region of the first conductivity type by diffusing impurities included in the fifth ion-implantation layer and the sixth ion-implantation layer; and the third impurity region is formed in the semiconductor substrate between the second side surface and the third side surface.

5. The manufacturing method of the semiconductor device according to claim 4, wherein the third ion-implantation energy is larger than the fourth ion-implantation energy.

6. The manufacturing method of the semiconductor device according to claim 4, further comprising the steps of:

(k) after the step of (i), forming a base region of the second conductivity type in the third impurity region close to the upper surface of the semiconductor substrate so as to be shallower than the first bottom surface of the first trench and the second bottom surface of the second trench;

(l) after the step of (k), forming an emitter region of the first conductivity type in the base region;

(m) after the step of (l), forming an interlayer insulating film on the upper surface of the semiconductor substrate so as to cover the first trench and the second trench;

(n) after the step of (m), forming a gate wiring and an emitter electrode on the interlayer insulating film;

(o) after the step of (n), forming a collector region of the second conductivity type in the semiconductor substrate close to the bottom surface of the semiconductor substrate; and (p) after the step of (o), forming a collector electrode on the bottom surface of the semiconductor substrate, wherein the emitter region and the base region are electrically connected to the emitter electrode, the first gate electrode and the second gate electrode are electrically connected to the gate wiring, and the collector region is electrically connected to the collector electrode.

7. The manufacturing method of the semiconductor device according to claim 6, wherein in the step of (c), forming a seventh ion-implantation layer in the semiconductor substrate by performing the first ion-implantation;

in the step of (d), forming an eighth ion-implantation layer at a position overlapping the seventh ion-implantation layer in the semiconductor substrate in plan view by performing the second ion-implantation;

in the step of (f), by performing the first heat treatment, forming a fourth impurity region of the second conductivity type by diffusing impurities included in the seventh ion-implantation layer and the eighth ion-implantation layer;

in the step of (g), forming a third trench and a fourth trench on the upper surface of the semiconductor substrate;

in the step of (h), forming a third gate insulating film in the third trench and forming a fourth gate insulating film in the fourth trench; and in the step of (i), forming a third gate electrode so as to fill in the third trench via the third gate insulating film and forming a fourth gate electrode so as to fill in the fourth trench via the fourth gate insulating film, wherein the third trench has a fifth side surface, a sixth side surface facing to the fifth side surface and a third bottom surface connecting the fifth side surface and the sixth side surface, the fourth trench has a seventh side surface, an eighth side surface facing to the seventh side surface and a fourth bottom surface connecting the seventh side surface and the eighth side surface, the third trench and the fourth trench are spaced apart such that from the sixth side surface and the seventh side surface are adjacent each other, the second impurity region is formed in the semiconductor substrate between the fourth side surface and the fifth side surface and covers the third bottom surface so as to pass under and not substantially contact the sixth side surface, the fourth impurity region is formed in the semiconductor substrate close to the eighth side surface and covers the fourth bottom surface so as to pass under and not substantially contact the seventh side surface, the interlayer insulating film is formed so as to cover the third trench and the fourth trench, and the third gate electrode and the fourth gate electrode are electrically connected to the emitter electrode.

8. The manufacturing method of the semiconductor device according to claim 7, wherein the second impurity region and the fourth impurity region are in contact with each other.

9. A manufacturing method of a semiconductor device comprising the steps of:

(a) preparing a semiconductor substrate of a first conductivity type having an upper surface and a bottom surface opposite to the upper surface;

(b) after the step of (a), forming a first ion-implantation layer and a second ion-implantation layer in the semiconductor substrate by performing a first ion-implantation;

(c) after the step of (b), by performing a first heat treatment for the semiconductor substrate, forming a first impurity region of a second conductivity type opposite to the first conductivity type by diffusing impurities included in the first ion-implantation layer and forming a second impurity region of the second conductivity type by diffusing impurities included in the second ion-implantation layer;

(d) after the step of (c), forming a first trench and a second trench on the upper surface of the semiconductor substrate;

(e) after the step of (d), forming a first gate insulating film in the first trench and forming a second gate insulating film in the second trench; and (f) after the step of (e), forming a first gate electrode so as to fill in the first trench via the first gate insulating film and forming a second gate electrode so as to fill in the second trench via the second gate insulating film, wherein the first trench has a first side surface, a second side surface facing to the first side surface and a first bottom surface connecting the first side surface and the second side surface, the second trench has a third side surface, a fourth side surface facing to the third side surface and a second bottom surface connecting the third side surface and the fourth side surface, the first trench and the second trench are separated apart such that the second side surface and the third side surface are adjacent each other, the first impurity region is formed in the semiconductor substrate close to the first side surface and covers the first bottom surface so as to pass under and not substantially contact the second side surface, the second impurity region is formed in the semiconductor substrate close to the fourth side surface and covers the second bottom surface so as to pass under and not substantially contact the third side surface, the first impurity region and the second impurity region are spaced apart from each other, and in the step of (d), forming the first trench and the second trench so as to be positions of each of the first bottom surface and the second bottom surface shallower than peak positions of an impurity concentration of each of the first ion-implantation layer and the second ion-implantation layer.

10. The manufacturing method of the semiconductor device according to claim 9, wherein in the step of (e), a silicon oxide film is formed by thermal oxidation method, the first gate insulating film and the second gate insulating film are included the silicon oxide film, and in the step of (c), the first heat treatment is performed at lower temperature and shorter time than a heat treatment performed by thermal oxidation method.

11. The manufacturing method of the semiconductor device according to claim 9, wherein the first heat treatment is performed at a temperature of 700 to 900 degree Celsius with a process time of 30 to 150 seconds.

12. The manufacturing method of the semiconductor device according to claim 9, after the step of (a) before the step of (b) or after the step of (b) before the step of (c), (g1) forming a second resist pattern on the upper surface of the semiconductor substrate;

(g2) after the step of (g1), forming a fifth ion-implantation layer in the semiconductor substrate by performing a third ion-implantation with a third ion-implantation energy by using the second resist pattern as a mask;

(g3) after the step of (g2), forming a sixth ion-implantation layer at a position overlapping the fifth ion-implantation layer in the semiconductor substrate in plan view by performing a fourth ion-implantation with a fourth ion-implantation energy different of the third ion-implantation energy by using the second resist pattern as a mask; and (g4) after the step of (g3), removing the second resist pattern, wherein in the step of (c), by performing the first heat treatment for the semiconductor substrate, forming a third impurity region of the first conductivity type by diffusing impurities included in the fifth ion-implantation layer and the sixth ion-implantation layer; and the third impurity region is formed in the semiconductor substrate between the second side surface and the third side surface.

13. The manufacturing method of the semiconductor device according to claim 12, wherein the third ion-implantation energy is larger than the fourth ion-implantation energy.

14. The manufacturing method of the semiconductor device according to claim 13, further comprising the steps of:

(h) after the step of (f), forming a base region of the second conductivity type in the third impurity region close to the upper surface of the semiconductor substrate so as to be shallower than the first bottom surface of the first trench and the second bottom surface of the second trench;

(i) after the step of (h), forming an emitter region of the first conductivity type in the base region;

(j) after the step of (i), forming an interlayer insulating film on the upper surface of the semiconductor substrate so as to cover the first trench and the second trench;

(k) after the step of (j), forming a gate wiring and an emitter electrode on the interlayer insulating film;

(l) after the step of (k), forming a collector region of the second conductivity type in the semiconductor substrate close to the bottom surface of the semiconductor substrate; and (m) after the step of (l), forming a collector electrode on the bottom surface of the semiconductor substrate, wherein the emitter region and the base region are electrically connected to the emitter electrode, the first gate electrode and the second gate electrode are electrically connected to the gate wiring, and the collector region is electrically connected to the collector electrode.

15. The manufacturing method of the semiconductor device according to claim 14, wherein in the step of (b), forming a seventh ion-implantation layer in the semiconductor substrate by performing the first ion-implantation;

in the step of (c), by performing the first heat treatment, forming a fourth impurity region of the second conductivity type by diffusing impurities included in the seventh ion-implantation layer;

in the step of (d), forming a third trench and a fourth trench on the upper surface of the semiconductor substrate;

in the step of (e), forming a third gate insulating film in the third trench and forming a fourth gate insulating film in the fourth trench; and in the step of (f), forming a third gate electrode so as to fill in the third trench via the third gate insulating film and forming a fourth gate electrode so as to fill in the fourth trench via the fourth gate insulating film, wherein the third trench has a fifth side surface, a sixth side surface facing to the fifth side surface and a third bottom surface connecting the fifth side surface and the sixth side surface, the fourth trench has a seventh side surface, an eighth side surface facing to the seventh side surface and a fourth bottom surface connecting the seventh side surface and the eighth side surface, the third trench and the fourth trench are spaced apart such that the sixth side surface and the seventh side surface are adjacent each other, the second impurity region is formed in the semiconductor substrate between the fourth side surface and the fifth side surface and covers the third bottom surface so as to pass under and not substantially contact the sixth side surface, the fourth impurity region is formed in the semiconductor substrate close to the eighth side surface and covers the fourth bottom surface so as to pass under and not substantially contact the seventh side surface, the interlayer insulating film is formed so as to cover the third trench and the fourth trench, and the third gate electrode and the fourth gate electrode are electrically connected to the emitter electrode.

16. The manufacturing method of the semiconductor device according to claim 15, wherein the second impurity region and the fourth impurity region are in contact with each other.

* * * * *